(12) United States Patent
Kang

(10) Patent No.: US 9,748,248 B2
(45) Date of Patent: Aug. 29, 2017

(54) SEMICONDUCTOR DEVICE HAVING BURIED GATE STRUCTURE, METHOD FOR MANUFACTURING THE SAME, MEMORY CELL HAVING THE SAME, AND ELECTRONIC DEVICE HAVING THE SAME

(71) Applicant: SK hynix Inc., Gyeonggi-do (KR)

(72) Inventor: Dong-Kyun Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/130,727

(22) Filed: Apr. 15, 2016

(65) Prior Publication Data
US 2017/0125422 A1 May 4, 2017

(30) Foreign Application Priority Data
Oct. 28, 2015 (KR) .................. 10-2015-0150128

(51) Int. Cl.
| H01L 27/108 | (2006.01) |
| H01L 29/49 | (2006.01) |
| H01L 29/78 | (2006.01) |
| H01L 29/423 | (2006.01) |

(52) U.S. Cl.
CPC .. *H01L 27/10823* (2013.01); *H01L 27/10811* (2013.01); *H01L 29/4236* (2013.01); *H01L 29/4966* (2013.01); *H01L 29/7813* (2013.01); *H01L 29/7825* (2013.01)

(58) Field of Classification Search
CPC .......... H01L 27/10823; H01L 29/7813; H01L 29/7825; H01L 29/4236
See application file for complete search history.

(56) References Cited

U.S. PATENT DOCUMENTS

| 7,071,086 B2 | 7/2006 | Woo et al. |
| 2014/0203366 A1 | 7/2014 | Schulz et al. |
| 2015/0214313 A1* | 7/2015 | Oh .................... H01L 27/10876 257/2 |

FOREIGN PATENT DOCUMENTS

JP 201550291 3/2015

* cited by examiner

*Primary Examiner* — Thanhha Pham
(74) *Attorney, Agent, or Firm* — IP & T Group LLP

(57) ABSTRACT

A semiconductor device includes a substrate including a trench; a gate dielectric layer formed over a surface of the trench; a gate electrode positioned in the trench at a level lower than a top surface of the substrate, and including a first buried portion and a second buried portion over the first buried portion; and a first doping region and a second doping region formed in the substrate on both sides of the gate electrode, and overlapping with the second buried portion, wherein the first buried portion includes a first barrier which has a first work function, and the second buried portion includes a second barrier which has a second work function lower than the first work function.

19 Claims, 14 Drawing Sheets

SEMICONDUCTOR DEVICE HAVING BURIED GATE STRUCTURE, METHOD FOR MANUFACTURING THE SAME, MEMORY CELL HAVING THE SAME, AND ELECTRONIC DEVICE HAVING THE SAME

CROSS-REFERENCE TO RELATED APPLICATION

This application claims priority under 35 U.S.C. §119 to Korean Patent Application No. 10-2015-0150128 filed on Oct. 28, 2015, the disclosure of which is herein incorporated by reference in its entirety.

TECHNICAL FIELD

Exemplary embodiments relate to a semiconductor device, and more particularly, to a semiconductor device having a buried gate structure, a method for manufacturing the same, a memory cell having the same, and an electronic device having the same.

DISCUSSION OF THE RELATED ART

A metal gate electrode is applied for high performance of a transistor. In particular, in a buried gate type transistor, control of a threshold voltage is required for high performance operation. Furthermore, a gate-induced drain leakage (GIDL) characteristic exerts a substantial influence on performance of a buried gate type transistor.

SUMMARY

Various embodiments are directed to a buried gate structure capable of adjusting a threshold voltage, and a method for manufacturing the same. Various embodiments are directed to a semiconductor device capable of improving gate-induced drain leakage (GIDL), and a method for manufacturing the same. Various embodiments are directed to a memory cell capable of improving a refresh characteristic. Various embodiments are directed to an electronic device with improved performance.

In an embodiment, a semiconductor device may include: a substrate including a trench; a gate dielectric layer formed over a surface of the trench; a gate electrode positioned in the trench and at a level lower than a top surface of the substrate, wherein the gate electrode includes a first buried portion and a second buried portion, wherein the second buried portion is formed over the first buried portion; and a first doping region and a second doping region formed in the substrate and over first and second sides of the gate electrode, wherein each of the first doping region and the second doping region overlaps the second buried portion, wherein the first buried portion includes a first barrier with a first work function, wherein the second buried portion includes a second barrier with a second work function, and wherein the second work function is lower than the first work function. The first barrier has a work function higher than a mid-gap work function of silicon, and wherein the second barrier has a work function lower than the mid-gap work function of silicon. The first barrier may include metal silicon nitride of with 20 at % or less of silicon, and the second barrier may include metal silicon nitride with 30 at % or more of silicon. The first barrier includes titanium silicon nitride with 20 at % or less of silicon, and wherein the second barrier includes titanium silicon nitride with 30 at % or more of silicon. The first barrier may include tantalum silicon nitride with 20 at % or less of silicon, and wherein the second barrier includes tantalum silicon nitride with 30 at % or more of silicon. The first buried portion may further include a first electrode, wherein the first electrode may include a metal-containing material, and wherein the first barrier is positioned between the first electrode and the gate dielectric layer. The second buried portion may further includes a second electrode, wherein the second electrode may include a metal-containing material or N-type doped polysilicon, and wherein the second barrier is positioned between the second electrode and the gate dielectric layer.

In an embodiment, a semiconductor device may include: a substrate including a trench; a gate dielectric layer formed over a surface of the trench; a gate electrode positioned in the trench and at a level lower than a top surface of the substrate, wherein the gate electrode includes a first buried portion and a second buried portion, wherein the second buried portion is formed over the first buried portion; a first doping region and a second doping region each formed in the substrate and respectively over first and second sides of the gate electrode, wherein each of the first doping region and the second doping region overlaps the second buried portion; and a work function adjustment liner positioned between the first buried portion and the gate dielectric layer, wherein the first buried portion includes a first barrier with a first work function, wherein the second buried portion includes a second barrier with a second work function, and wherein the second work function is lower than the first work function. The work function adjustment liner may include a material which generates a dipole so that the first work function of the first buried portion increases and is higher than the first work function. The work function adjustment liner may include metal oxide, and an areal density of oxygen atoms of the metal oxide is higher than an areal density of oxygen atoms of the gate dielectric layer. The gate dielectric layer may include silicon oxide, and the work function adjustment liner may include aluminum oxide. The gate dielectric layer may include silicon oxide, and the work function adjustment liner may include titanium oxide, hafnium oxide, zirconium oxide, magnesium oxide, or a combination thereof. The first barrier may include titanium silicon nitride with 20 at % or less of silicon, and the second barrier may include titanium silicon nitride with 30 at % or more of silicon. The first barrier may include tantalum silicon nitride with 20 at % or less of silicon, and the second barrier may include tantalum silicon nitride with 30 at % or more of silicon. The first buried portion may further includes a first electrode, the first electrode includes metal-containing material, and wherein the first barrier is positioned between the first electrode and the gate dielectric layer. The second buried portion may further include a second electrode, the second electrode may include a metal-containing material or N-type doped polysilicon, and the second barrier is positioned between the second electrode and the gate dielectric layer.

In an embodiment, a semiconductor device may include: a substrate including a trench; a gate dielectric layer formed over a surface of the trench; a gate electrode positioned over the gate dielectric layer, in the trench, and at a level lower than a top surface of the substrate, wherein the gate electrode includes a first buried portion and a second buried portion, wherein the second buried portion is provided over the first buried portion; a first doping region and a second doping region each formed in the substrate and respectively over first and second sides of the gate electrode, wherein each of the first doping region and the second doping region overlaps the second buried portion; a first work function adjustment liner positioned between the first buried portion and the gate dielectric layer; and a second work function adjustment liner positioned between the second buried portion and the gate dielectric layer, wherein the first buried portion includes a first barrier with a first work function value, wherein the second buried portion includes a second barrier with a second work function value, and wherein the second work function value is lower than the first work function value.

The first barrier may include titanium silicon nitride with 20 at % or less of silicon, and the second barrier may include titanium silicon nitride with 30 at % or more of silicon. The first barrier may include tantalum silicon nitride with 20 at % or less of silicon, and the second barrier may include tantalum silicon nitride with 30 at % or more of silicon. The first work function adjustment liner may include a first metal oxide, an areal density of oxygen atoms of the first metal oxide is higher than an areal density of oxygen atoms of the gate dielectric layer, wherein the second work function adjustment liner may include a second metal oxide, and wherein an areal density of oxygen atoms of the second metal oxide is lower than an areal density of oxygen atoms of the gate dielectric layer. The gate dielectric layer may include silicon oxide, and the first work function adjustment liner may include aluminum oxide, titanium oxide, hafnium oxide, zirconium oxide, magnesium oxide, or a combination thereof. The gate dielectric layer may include silicon oxide, and the second work function adjustment liner may include yttrium oxide, lanthanum oxide, germanium oxide, lutetium oxide, strontium oxide, or a combination thereof.

The first buried portion may further include a first electrode. The first electrode may include a metal-containing material, and wherein the first barrier is positioned between the first electrode and the gate dielectric layer. The second buried portion may further include a second electrode, the second electrode may include a metal-containing material or N-type doped polysilicon, and the second barrier is positioned between the second electrode and the gate dielectric layer.

In an embodiment, a method for manufacturing a semiconductor device may include: forming a trench in a semiconductor substrate; forming a gate dielectric layer over a bottom surface and sidewalls of the trench; forming a gate electrode filling the trench and provided over the gate dielectric layer, wherein a top surface of the gate electrode is located at a lower level than a top surface of the semiconductor substrate; and forming doping regions in the semiconductor substrate and over first and second sides of the gate electrode, the forming of the gate electrode may include: forming a first buried portion, wherein the first buried portion includes a first barrier having a first silicon content; and forming a second buried portion over the first buried portion, wherein the second buried portion includes a second barrier having a second silicon content. The first silicon content is higher than the second silicon content.

The first barrier may include a material with a work function higher than a mid-gap work function of silicon, and the second barrier may include a material with a work function lower than the mid-gap work function of silicon. The first barrier may include titanium silicon nitride containing 20 at % or less of silicon, and the second barrier may include titanium silicon nitride containing 30 at % or more of silicon. The first barrier may include tantalum silicon nitride containing 20 at % or less of silicon, and the second barrier may include tantalum silicon nitride containing 30 at % or more of silicon.

The method may further include forming a first work function adjustment liner between the gate dielectric layer and the first barrier. The first work function adjustment liner may include a first metal oxide, and an areal density of oxygen atoms of the first metal oxide is higher than an areal density of oxygen atoms of the gate dielectric layer. The gate dielectric layer may include silicon oxide, and the first work function adjustment liner may include aluminum oxide, titanium oxide, hafnium oxide, zirconium oxide, magnesium oxide, or a combination thereof.

The method may further include forming a second work function adjustment liner between the second barrier and the gate dielectric layer. The second work function adjustment liner may include a second metal oxide, and an areal density of oxygen atoms of the second metal oxide is lower than an areal density of oxygen atoms of the gate dielectric layer. The gate dielectric layer may include silicon oxide, and the second work function adjustment liner includes yttrium oxide, lanthanum oxide, germanium oxide, lutetium oxide, strontium oxide, or a combination thereof.

DETAILED DESCRIPTION

Figure 1:
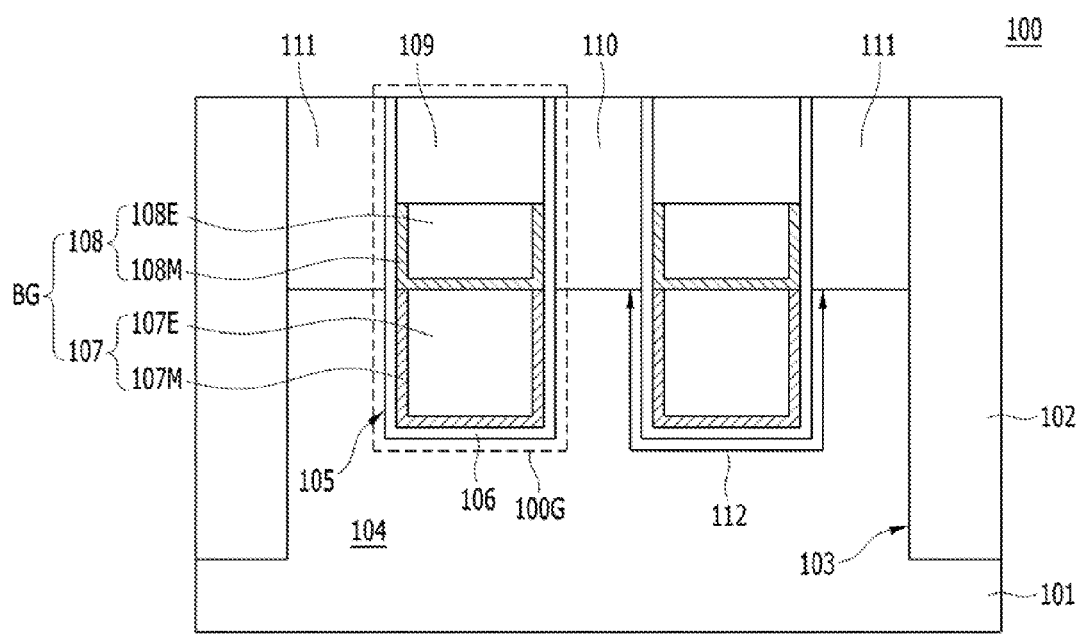
FIG. 1 is a view illustrating an example of a semiconductor device in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on"

a substrate, it not only refers to a case in which the first layer is formed directly on the second layer or the substrate but also a case in which a third layer exists between the first layer and the second layer or the substrate.

Hereinbelow, in embodiments, a threshold voltage (Vt) depends on a flat-band voltage. The flat-band voltage depends on a work function. The work function may be engineered by various methods. For example, the work function may be adjusted by a material of a gate electrode, a material between the gate electrode and a channel, and so forth. By increasing or decreasing the work function, the flat-band voltage may be shifted. A high work function may shift the flat-band voltage in a positive direction, and a low work function may shift the flat-band voltage in a negative direction. By shifting the flat-band voltage as described above, it is possible to adjust a threshold voltage. In the embodiments, even though a channel concentration is decreased or channel doping is omitted, a threshold voltage may be adjusted by shifting the flat-band voltage. The flat-band voltage may be shifted by a conductive barrier having the high work function.

FIG. 1 is a view illustrating an example of a semiconductor device in accordance with a first embodiment. Referring to FIG. 1, a semiconductor device 100 may include a buried gate structure 100G, a first doping region 110, and a second doping region 111. An isolation layer 102 and an active region 104 may be formed in a substrate 101. The first doping region 110 and the second doping region 111 may be disposed in the active region 104. A trench which traverses the active region 104 and the isolation layer 102, that is, a gate trench 105, may be formed. The buried gate structure 100G may be formed in the gate trench 105. A channel 112 may be formed between the first doping region 110 and the second doping region 111 by the gate trench 105.

The semiconductor device 100 is formed in the substrate 101. The substrate 101 may be a material appropriate for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include another semiconductor material such as germanium. The substrate 101 may include a III/V group semiconductor substrate, for example, a compound semiconductor substrate such as GaAs. The substrate 101 may include a silicon-on-insulator (SOI) substrate.

The isolation layer 102 and the active region 104 may be formed in the substrate 101. The active region 104 may be defined by the isolation layer 102. The isolation layer 102 may be a shallow trench isolation (STI) region which is formed by trench etching. The isolation layer 102 may be formed by filling a dielectric material in a shallow trench, for example, an isolation trench 103. The isolation layer 102 may include silicon oxide, silicon nitride, or a combination thereof.

The gate trench 105 may be formed in the substrate 101. When viewed from the top, the gate trench 105 may be a line shape which extends in any one direction. The gate trench 105 may be a line shape which traverses the active region 104 and the isolation layer 102. The gate trench 105 may have a depth shallower than the isolation trench 103. In another embodiment, the bottom of the gate trench 105 may be rounded and have a given curvature.

The first doping region 110 and the second doping region 111 may be formed in the active region 104. The first doping region 110 and the second doping region 111 are regions which are doped with a conductive dopant. For example, each of the first and the second dopant regions 110, 111 may include phosphorus (P), arsenic (As), antimony (Sb) or boron (B). The first doping region 110 and the second doping region 111 may be doped with a same conductive dopant.

The first doping region 110 and the second doping region 111 are positioned in the active region 104 and on both sides of the gate trench 105. The first doping region 110 and the second doping region 111 may be referred to as a source region and a drain region, respectively. The bottom surfaces of the first doping region 110 and the second doping region 111 may be positioned at a predetermined depth from the top surface of the active region 104. The first doping region 110 and the second doping region 111 may adjoin the sidewalls of the gate trench 105. The bottom surfaces of the first doping region 110 and the second doping region 111 may be higher than the bottom surface of the gate trench 105.

The buried gate structure 100G may be embedded in the gate trench 105. The buried gate structure 100G may be disposed in the active region 104 between the first doping region 110 and the second doping region 111, and may extend into the isolation layer 102. In the buried gate structure 100G, the bottom surface of a portion which is disposed in the active region 104 and the bottom surface of a portion which is disposed in the isolation layer 102 may be positioned at the same level.

The buried gate structure 100G may include a gate dielectric layer 106, a gate electrode BG, and a capping layer 109. The gate electrode BG may be positioned at a level lower than the top surface of the active region 104. The gate electrode BG may partially fill the gate trench 105. Accordingly, the gate electrode BG may be referred to as a 'buried gate electrode.' The capping layer 109 may be positioned on the gate electrode BG. The gate dielectric layer 106 may be formed on the bottom surface and sidewalls of the gate trench 105.

The gate dielectric layer 106 may include silicon oxide, silicon nitride, silicon oxynitride, a high-k material, or a combination thereof. The high-k material may refer to a material which has a dielectric constant higher than the dielectric constant of silicon oxide. For example, the high-k material may include a material which has a dielectric constant higher than 3.9. For another example, the high-k material may include a material which has a dielectric constant higher than 10. For still another example, the high-k material may include a material which has a dielectric constant of 10 to 30. The high-k material may include at least one metallic element. The high-k material may include a hafnium-containing material. A hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, or a combination thereof. Any conventional high-k materials which are known in the art may be used as the high-k material.

The channel 112 may be formed along the gate electrode BG between the first doping region 110 and the second doping region 111. That is to say, the channel 112 may be formed in the active region 104 along the gate trench 105. The channel 112 has a channel length longer than a conventional planar type transistor. Due to this fact, the short channel effect may be substantially prevented.

The gate electrode BG may include a first buried portion 107 and a second buried portion 108. The first buried portion 107 may fill a lower portion of the gate trench 105. The second buried portion 108 may be positioned on the first buried portion 107. The second buried portion 108 may be located at the same level as the first doping region 110 and the second doping region 111. The second buried portion 108 may overlap with the first doping region 110 and the second doping region 111. The second buried portion 108 is partially filled in the gate trench 105 and on the first buried portion 107. The height of the top surface of the second buried portion 108 may be located at a lower level than the top surface of the substrate 101. The first buried portion 107 may be overlap with the channel 112. The gate dielectric layer 106 is interposed between the first buried portion 107 and the channel 112. The gate dielectric layer 106 further extends (i) between the second buried portion 108 and the first doping region 110 and (ii) between the second buried portion 108 and the second doping region 111.

The capping layer 109 protects the gate electrode BG. The capping layer 109 may include a dielectric material. The capping layer 109 may include silicon nitride, silicon oxynitride, or a combination thereof. In another embodiment, the capping layer 109 may include a combination of silicon nitride and silicon oxide. For example, the capping layer 109 may include a silicon nitride liner and a spin-on-dielectric (SOD). For example, in order to form the capping layer 109, the silicon nitride liner is formed on the top buried portion 108 and then, a spin-on-dielectric (SOD) may be filled on the silicon nitride liner. While not shown, a hard mask such as the hard mask 15 shown in FIG. 6F, may be formed on the substrate 101.

The gate electrode BG will be described below in detail. The gate electrode BG may include the first buried portion 107 and the second buried portion 108. The first buried portion 107 may include a plurality of layers of electrode materials. For example, the first buried portion 107 may include a first barrier 107M and a first electrode 107E. The first barrier 107M may be also referred to as a first liner electrode. The first electrode 107E may be also referred to as a first low resistivity electrode. The first barrier 107M may have a high work function. The high work function refers to a work function higher than the mid-gap work function of silicon. A low work function refers to a work function lower than the mid-gap work function of silicon. That is, the high work function may be a work function higher than 4.5 eV, and the low work function may be a work function lower than 4.5 eV.

The first barrier 107M may be a conductive material. The first barrier 107M may be a metal-base material to reduce the resistivity of the gate electrode BG. The first barrier 107M may be metal silicon nitride. The first barrier 107M may be metal silicon nitride of which a silicon content is adjusted. For example, the first barrier 107M may be titanium silicon nitride (TiSiN). In order to have a high work function, a silicon content in titanium silicon nitride may be adjusted. For example, the silicon content in the titanium silicon nitride may be 20 at % (atomic percent) or less.

The second buried portion 108 may include a plurality of layers of electrode materials. For example, the second buried portion 108 may include a second barrier 108M and a second electrode 108E. The second barrier 108M may be also referred to as a second liner electrode, and the second electrode 108E may be also referred to as a second low resistivity electrode. The second barrier 108M may have a low work function. The second barrier 108M may be a conductive material. The second barrier 108M may be a metal-base material to reduce the resistivity of the gate electrode BG. The second barrier 108M may be metal silicon nitride. The first barrier 107M and the second barrier 108M may be materials having silicon contents which are different from each other. The second barrier 108M may be a metallic material of which a silicon content is adjusted. For example, the second barrier 108M may be titanium silicon nitride (TiSiN). In order to have a low work function, the silicon content in the titanium silicon nitride may be adjusted. In order to have a low work function, the silicon content in the titanium silicon nitride may be 30 at % or more.

As described above, although the respective first barrier 107M and second barrier 108M may be titanium silicon nitride, silicon contents thereof may be different from each other to have a difference in work function. In another embodiment, the first barrier 107M and the second barrier 108M may include metal silicon nitride such as tantalum silicon nitride (TaSiN). Tantalum silicon nitride (TaSiN) may have different work function values depending on its silicon content. In order to have a high work function, a silicon content in tantalum silicon nitride may be 20 at % or less. In order to have a low work function, a silicon content in tantalum silicon nitride may be 30 at % or more. For example, the first barrier 107M may be titanium silicon nitride having a high work function, and the second barrier 108M may be tantalum silicon nitride having a low work function. In another embodiment, the first barrier 107M may be tantalum silicon nitride having a high work function, and the second barrier 108M may be titanium silicon nitride having a low work function. The first barrier 107M and the second barrier 108M may serve also as electrodes.

The first electrode 107E and the second electrode 108E may be the same material or different materials. The first electrode 107E and the second electrode 108E may include metal-base materials to reduce the resistivity of the gate electrode BG. Tungsten (W) may be used as the first electrode 107E and the second electrode 108E. In the case where tungsten is used as the first electrode 107E and the second electrode 108E, an attack to the gate dielectric layer 106 may occur. For example, tungsten may be deposited using tungsten hexafluoride ($WF_6$) gas, and the gate dielectric layer 106 may be attacked by fluorine. Therefore, in order to substantially prevent an attack by the fluorine, the first barrier 107M may be formed between the first electrode 107E and the gate dielectric layer 106. Further, the second barrier 108M may be formed between the second electrode 108E and the gate dielectric layer 106. In this way, the first barrier 107M and the second barrier 108M may perform the functions of barriers and be formed of materials with adjusted work function values.

The first doping region 110, the second doping region 111 and the buried gate structure 100G may construct a transistor. For example, the transistor may be referred to as a 'buried gate type transistor.' The channel 112 may be defined along the surface of the gate trench 105 between the first doping region 110 and the second doping region 111. In another embodiment, the channel 112 may include a dopant by channel doping.

According to the first embodiment, the first barrier 107M is a material which has a high work function, and the second barrier 108M is a material which has a low work function.

A threshold voltage (Vt) is adjusted by the first barrier 107M. For example, a flat-band voltage may be shifted by the first barrier 107M with a high work function. According to this fact, a threshold voltage may be easily adjusted. Because the gate trench 105 has a high aspect ratio it is difficult to perform sufficient doping to the bottom portion of the gate trench 105 by a conventional channel doping method. Therefore, after channel doping, additional channel doping is locally performed for the bottom portion of the gate trench 105. This is referred to as 'local channel doping.' In the case where implantation is adopted as the local channel doping, the implantation is referred to as local channel implantation (LCI). Since a threshold voltage may be adjusted by the first barrier 107M of a high work function, the dose of the local channel doping (LCI) may be remarkably decreased or the local channel doping (LCI) may be omitted. Hence, in the present embodiment, since a channel dose may be decreased by the first barrier 107M with a high work function, a junction leakage characteristic may be improved.

Also, in the first embodiment, since the second barrier 108M has a low work function, it is possible to suppress gate-induced drain leakage (GIDL) in the first doping region 110 and the second doping region 111. In the case where the first barrier 107M overlaps with the first doping region 110 and the second doping region 111, gate-induced drain leakage (GIDL) may increase due to a high work function. Thus, the level at which the first barrier 107M is located may be adjusted so that the first barrier 107M does not overlap with the first doping region 110 and the second doping region 111. Table 1 shows a change in flat-band voltage ΔVFB depending on a change of the silicon contents.

TABLE 1

| Barrier | TiN | TiSiN(Si20 at %) | TiSiN(Si40 at %) |
| --- | --- | --- | --- |
| VFB(mV) | −204.4 | −155.7 | −289.3 |
| ΔVFB(mV) | 0 | 48.7 | −84.9 |

In Table 1, TiN, TiSiN(Si20 at %) and TiSiN(Si40 at %) may be formed to 45A, respectively. According to Table 1, a flat-band voltage by TiSiN(Si20 at %) is shifted in a positive direction (ΔVFB=48.7 mV) and a flat-band voltage by TiSiN(Si40 at %) is shifted in a negative direction (ΔVFB=−84.9 mV). The flat-band voltage shift amounts by TiSiN(Si20 at %) and TiSiN(Si40 at %) were measured based on TiN. In this way, flat-band voltages may be adjusted by adjusting silicon contents in TiSiN(Si20 at %) and TiSiN(Si40 at %).

The buried gate structure 100G in accordance with the first embodiment may be applied to a buried gate type fin channel transistor.

Figure 2A:
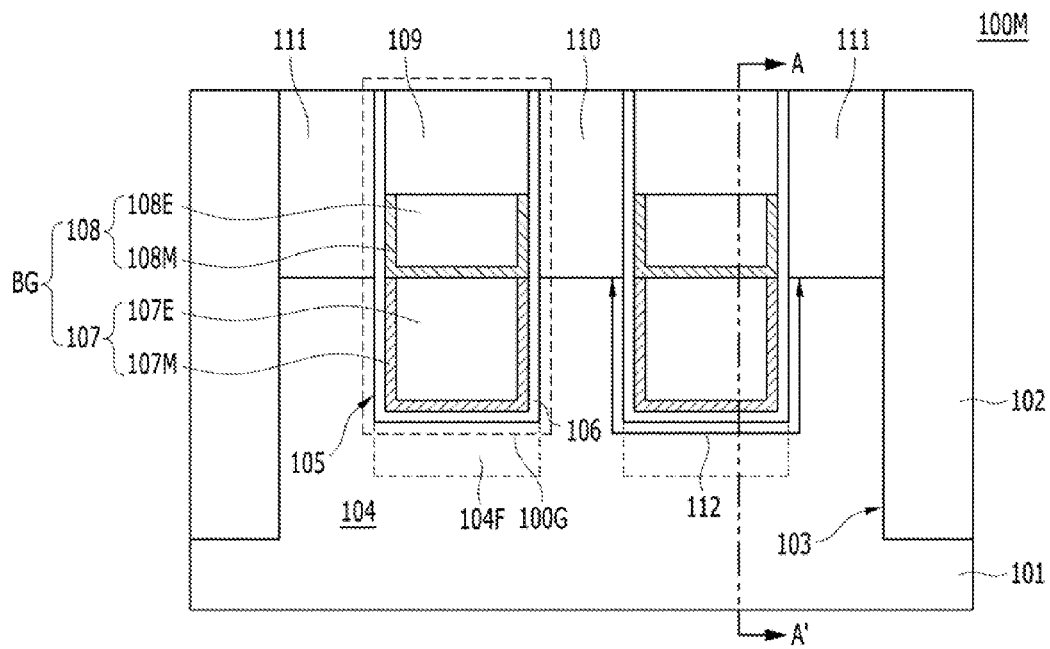
FIG. 2A is a view illustrating an example of a semiconductor device in accordance with a modification of the first embodiment.
Figure 2B:
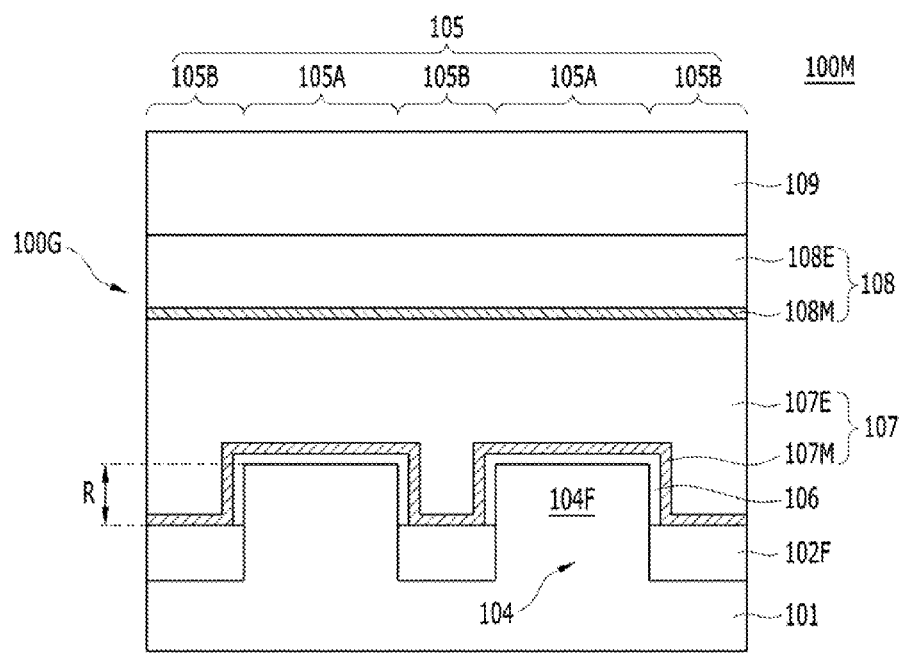
FIG. 2B is a cross-sectional view taken along the line A-A' of FIG. 2A.

FIGS. 2A and 2B are views illustrating a semiconductor device 100M in accordance with a modification of the first embodiment. FIG. 2B is a cross-sectional view taken along the line A-A' of FIG. 2A. In the semiconductor device 100M, the same or the like components as those of the semiconductor device 100 in accordance with the first embodiment are denoted with the same reference numerals.

A buried gate structure 100G of the semiconductor device 100M may include a gate dielectric layer 106, a first buried portion 107, a second buried portion 108, and a capping layer 109. The first buried portion 107 may include a first barrier 107M and a first electrode 107E. The second buried portion 108 may include a second barrier 108M and a second electrode 108E. The first barrier 107M and the second barrier 108M may include titanium silicon nitride (TiSiN) or tantalum silicon nitride (TaSiN). The first barrier 107M may have a silicon content of 20 at % or less to have a high work function, and the second barrier 108M may have a silicon content of 30 at % or more to have a low work function. The first electrode 107E and the second electrode 108E may include tungsten. The semiconductor device 100M further includes a fin region 104F. The fin region 104F may be positioned in an active region 104 under a gate trench 105.

The gate trench 105 may include a first trench 105A and a second trench 105B. The first trench 105A may be formed in the active region 104. The second trench 105B may be formed in an isolation layer 102. The second trench 105B may be continuously extended from the first trench 105A. The first trench 105A and the second trench 105B may have bottom surfaces which are positioned at different levels. For example, the bottom surface of the first trench 105A may be positioned at a level higher than the bottom surface of the second trench 105B. The height difference between the first trench 105A and the second trench 105B is formed as the isolation layer 102 is recessed. Therefore, the second trench 105B may include a recess region R which has a bottom surface lower than the bottom surface of the first trench 105A.

The fin region 104F is formed in the active region 104 due to a step difference between the first trench 105A and the second trench 105B. Accordingly, the active region 104 includes the fin region 104F.

In this way, the fin region 104F is formed under the first trench 105A, and the sidewalls of the fin region 104F are exposed by a recessed isolation layer 102F. The fin region 104F is a portion where a channel is formed. The fin region 104F is referred to as a saddle fin. By the fin region 104F, a channel width may be increased, and an electrical characteristic may be improved.

Figure 3:
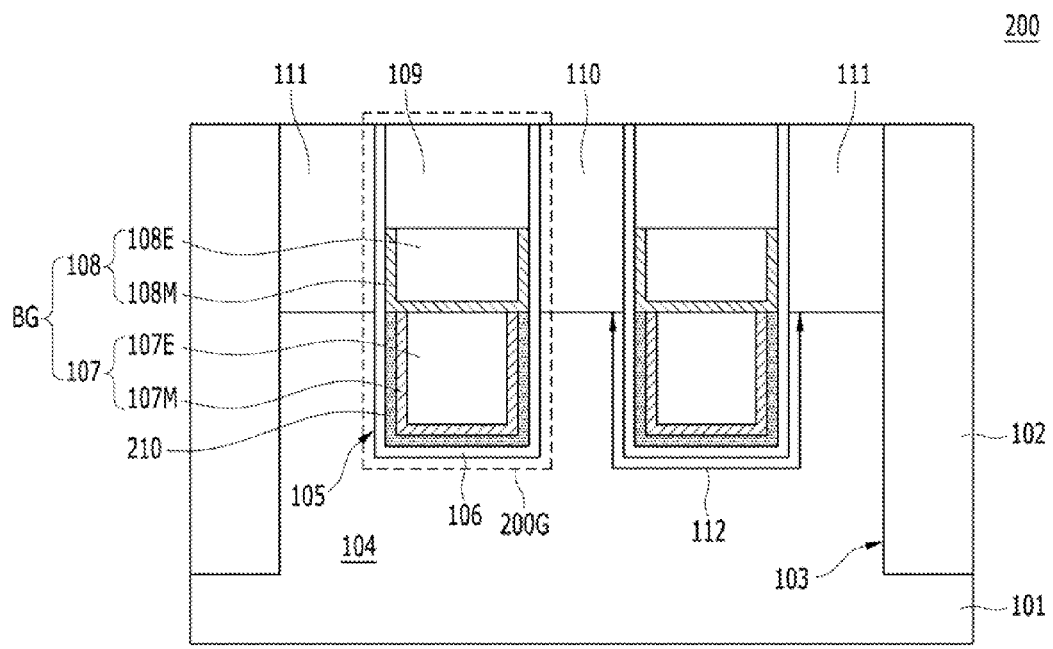
FIG. 3 is a view illustrating an example of a semiconductor device in accordance with a second embodiment.

FIG. 3 is a view illustrating a semiconductor device 200 in accordance with a second embodiment. In the semiconductor device 200 in accordance with the second embodiment, the same reference numerals indicate the same components as shown in the semiconductor device 100 in accordance with the first embodiment.

A buried gate structure 200G of the semiconductor device 200 may include a gate dielectric layer 106, a gate electrode BG, and a capping layer 109. The gate electrode BG may include a first buried portion 107 and a second buried portion 108. The first buried portion 107 may include a first barrier 107M and a first electrode 107E. The second buried portion 108 may include a second barrier 108M and a second electrode 108E. The first barrier 107M and the second barrier 108M may include titanium silicon nitride (TiSiN) or tantalum silicon nitride (TaSiN). The first barrier 107M may have a silicon content of 20 at % or less to have a high work function. The second barrier 108M may have a silicon content of 30 at % or more to have a low work function. The first electrode 107E and the second electrode 108E may include tungsten.

The buried gate structure 200G of the semiconductor device 200 may further include a work function adjustment liner 210. The work function adjustment liner 210 may be positioned between the first buried portion 107 and the gate dielectric layer 106. The work function adjustment liner 210 may be positioned between the first barrier 107M and the gate dielectric layer 106. A effective work function of the first buried portion 107, specifically, the effective work function of the first barrier 107M, may be increased by the work function adjustment liner 210. For example, in the case where the work function adjustment liner 210 and the gate dielectric layer 106 contact each other, a dipole may be generated. If the dipole is generated, a high work function characteristic may be induced due to a change in an energy band. In other words, the first barrier 107M of the first buried portion 107 may have an increased work function by the dipole.

The work function adjustment liner 210 may be also referred to as a 'high work function adjustment liner' or a 'dipole induction layer.' The work function adjustment liner 210 may be a dielectric material. The work function adjustment liner 210 may be metal oxide. The work function adjustment liner 210 may be a high-k material of which dielectric constant is higher than the gate dielectric layer 106. The work function adjustment liner 210 and the gate dielectric layer 106 may have different areal density of oxygen atoms from each other. That is, the areal density of oxygen contained in the work function adjustment liner 210 is different from the areal density of oxygen contained in the gate dielectric layer 106. For example, the work function adjustment liner 210 has a higher oxygen areal density than the gate dielectric layer 106. The work function adjustment liner 210 may be include metal oxide which has a higher oxygen areal density than the gate dielectric layer 106.

In the case where the gate dielectric layer 106 is $SiO_2$, the work function adjustment liner 210 may include aluminum oxide, titanium oxide, hafnium oxide, zirconium oxide or magnesium oxide. In the present embodiment, the work function adjustment liner 210 may include aluminum oxide ($Al_2O_3$). For example, the ratio of the areal density of $Al_2O_3$ to the oxygen areal density of $SiO_2$ may be 1.21. Since aluminum oxide has a higher oxygen areal density, a larger shift in flat-band voltage may occur. As aluminum oxide is applied as the work function adjustment liner 210, a stable interfacial state may be retained between the work function adjustment liner 210 and the gate dielectric layer 106. The work function adjustment liner 210 may be formed to a thin thickness. By this fact, by increasing the volume of the first buried portion 107 in the gate trench 105, it is possible to significantly decrease the resistivity of the gate electrode BG.

A threshold voltage (Vt) is adjusted by the work function adjustment liner 210. For example, a flat-band voltage may be shifted by the work function adjustment liner 210. The dipole may be formed between the work function adjustment liner 210 and the gate dielectric layer 106. The dipole may be generated by a difference in oxygen areal density between the work function adjustment liner 210 and the gate dielectric layer 106. The dipole may increase the work function of the first barrier 107M, and accordingly, a flat-band voltage may be shifted and a threshold voltage may be adjusted.

As a result, an impurity dose applied to a channel 112 may be decreased by the work function adjustment liner 210. By controlling the polarity direction of the dipole, it is possible to control the effective work function of the gate electrode BG. By such a method, the effective work function of the first barrier 107M of the gate electrode BG may be increased or decreased. For example, in the case where the work function adjustment liner 210 has a higher oxygen areal density than the gate dielectric layer 106, a dipole may be generated to increase work function. In the case where the work function adjustment liner 210 has a lower oxygen areal density than the gate dielectric layer 106, a dipole may be generated to decrease work function. In the present embodiment, since the work function adjustment liner 210 is a material which has a higher oxygen areal density than the gate dielectric layer 106, a dipole may be generated and work function increases.

According to the second embodiment, the first barrier 107M is a material which has a high work function, and the second barrier 108M is a material which has a low work function. The work function adjustment liner 210 may be a material which induces a high work function. For example, when the first barrier 107M has a first high work function, the combination of the first barrier 107M and the work function adjustment liner 210 may be induced a second high work function higher than the first high work function. As a consequence, a threshold voltage (Vt) is adjusted by the first barrier 107M and the work function adjustment liner 210. A flat-band voltage may be shifted by the first barrier 107M with a high work function, and may be further shifted by the work function adjustment liner 210.

By the second barrier 108M, gate-induced drain leakage (GIDL) may be improved. The buried gate structure 200G in accordance with the second embodiment may be applied to a buried gate type fin channel transistor as shown in FIG. 2A.

Figure 4:
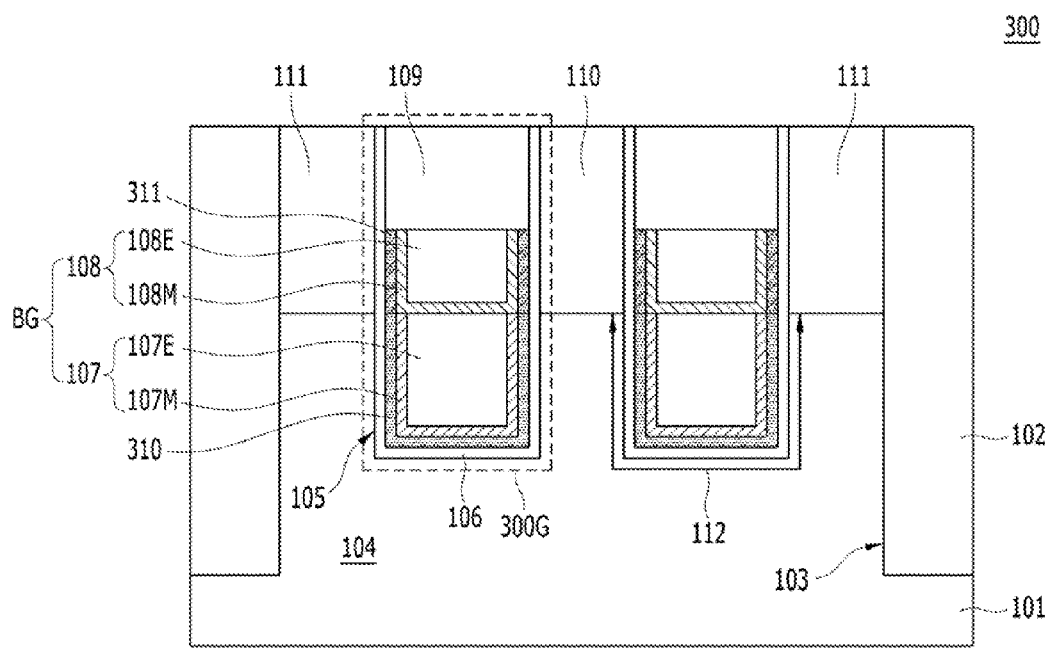
FIG. 4 is a view illustrating an example of a semiconductor device in accordance with a third embodiment.

FIG. 4 is a view illustrating a semiconductor device 300 in accordance with a third embodiment. In the semiconductor device 300 in accordance with the third embodiment, the same or the like components as those of the semiconductor device 100 in accordance with the first embodiment are denoted with the same reference numerals.

A buried gate structure 300G of the semiconductor device 300 may include a gate dielectric layer 106, a gate electrode BG, and a capping layer 109. The gate electrode BG may include a first buried portion 107 and a second buried portion 108. The first buried portion 107 may include a first barrier 107M and a first electrode 107E. The second buried portion 108 may include a second barrier 108M and a second electrode 108E. The first barrier 107M and the second barrier 108M may include titanium silicon nitride (TiSiN) or tantalum silicon nitride (TaSiN). The first barrier 107M may have a silicon content of 20 at % or less to have a high work function, and the second barrier 108M may have a silicon content of 30 at % or more to have a low work function. The first electrode 107E and the second electrode 108E may include tungsten. The semiconductor device 300 may further include a first work function adjustment liner 310 and a second work function adjustment liner 311.

The first work function adjustment liner 310 may be positioned between the first buried portion 107 and the gate dielectric layer 106. More specifically, the first work function adjustment liner 310 may be positioned between the first barrier 107M and the gate dielectric layer 106. The first work function adjustment liner 310 and the gate dielectric layer 106 may have different areal density of oxygen atoms from each other. By this fact, a first dipole may be formed between the first work function adjustment liner 310 and the gate dielectric layer 106.

The first work function adjustment liner 310 may be include metal oxide with a higher oxygen areal density. That is, the oxygen areal density of first work function adjustment liner 310 is higher than the oxygen areal density of the gate dielectric layer 106. In the case where the gate dielectric layer 106 is silicon oxide, the first work function adjustment liner 310 may include aluminum oxide, titanium oxide, hafnium oxide, zirconium oxide, or magnesium oxide. The first work function adjustment liner 310 may be formed to a thin thickness. By this fact, by increasing the volume of the first buried portion 107 in a gate trench 105, it is possible to significantly decrease the resistivity of the gate electrode BG.

A threshold voltage (Vt) is adjusted by the first work function adjustment liner 310. For example, a flat-band voltage may be shifted by the first work function adjustment liner 310. The first dipole may be generated due to a difference in oxygen areal density between the first work function adjustment liner 310 and the gate dielectric layer 106. The first dipole may increase the work function of the first barrier 107M, and accordingly, a flat-band voltage may be shifted. As a result, an impurity dose applied to a channel 112 may be decreased by the first work function adjustment liner 310.

In the case where the first work function adjustment liner 310 is a material which has a higher oxygen areal density than the gate dielectric layer 106, a first dipole may be generated in such a direction that the work function increases. In the present embodiment, since the first work function adjustment liner 310 is a material which has a higher oxygen areal density than the gate dielectric layer 106, a first dipole may be generated between the gate dielectric layer 106 and the first work function adjustment liner 310 in such a direction that the work function increases.

The second work function adjustment liner 311 may be positioned between the second buried portion 108 and the gate dielectric layer 106. The second work function adjustment liner 311 and the gate dielectric layer 106 may have different areal density of oxygen atoms from each other. By this fact, the second work function adjustment liner 311 and the gate dielectric layer 106 may generate a second dipole. The second work function adjustment liner 311 may include metal oxide with a lower oxygen areal density. For example, the second work function adjustment liner 311 has a lower oxygen areal density than the gate dielectric layer 106. Accordingly, the second dipole may decrease the work function of the second barrier 108M. In the case where the gate dielectric layer 106 is $SiO_2$, the second work function adjustment liner 311 may be formed of metal oxide with a lower oxygen areal density. For example, the second work function adjustment liner 311 has a lower oxygen areal density than the gate dielectric layer 106.

Metal oxide with a lower oxygen areal density may include yttrium oxide, lanthanum oxide, germanium oxide, lutetium oxide or strontium oxide. The second work function adjustment liner 311 may be located at the same level as a first doping region 110 and a second doping region 111 so that the second work function adjustment liner 311 may overlap with the first doping region 110 and the second doping region 111. For example, the second work function adjustment liner 311 may horizontally overlap with the first doping region 110 and the second doping region 111. The second work function adjustment liner 311 may have a spacer shape. Namely, the second work function adjustment liner 311 may not be positioned at the interface between the first buried portion 107 and the second buried portion 108.

The second work function adjustment liner 311 may be positioned between the second buried portion 108 and the first doping region 110 and between the second buried portion 108 and the second doping region 111. The second work function adjustment liner 311 and the first work function adjustment liner 310 may be coupled with each other. The second work function adjustment liner 311 and the first work function adjustment liner 310 may be the same or different in thickness.

According to the third embodiment, the first barrier 107M is a material which has a high work function, and the second barrier 108M is a material which has a low work function. The first work function adjustment liner 310 may be a material which induces a high work function. The second work function adjustment liner 311 may be a material which induces a low work function.

As a consequence, a threshold voltage may be adjusted by the first barrier 107M and the first work function adjustment liner 310. Gate-induced drain leakage (GIDL) may be improved by the second barrier 108M and the second work function adjustment liner 311. The buried gate structure 300G in accordance with the third embodiment may be applied to a buried gate type fin channel transistor as shown in FIG. 2A.

Figure 5A:
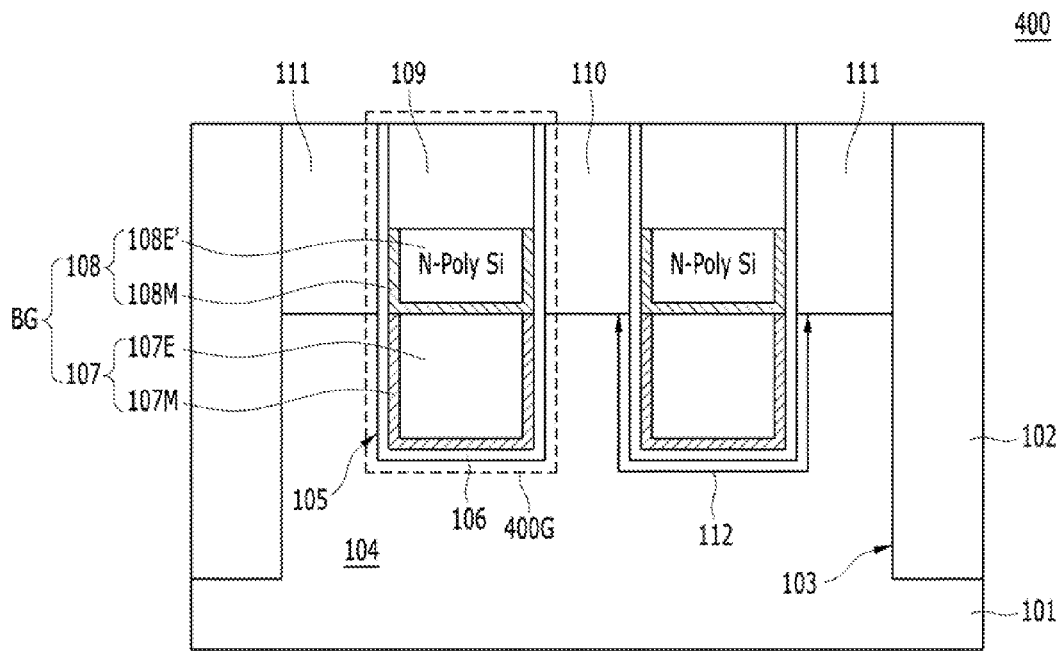
FIG. 5A is a view illustrating an example of a semiconductor device in accordance with a fourth embodiment.

FIG. 5A is a view illustrating a semiconductor device 400 in accordance with a fourth embodiment. Some components as shown in the semiconductor device 100 in accordance with the first embodiment are denoted with the same reference numerals.

The buried gate structure 400G of the semiconductor device 400 may include a gate dielectric layer 106, a gate electrode BG, and a capping layer 109. The gate electrode BG may include a first buried portion 107 and a second buried portion 108. The first buried portion 107 may include a first barrier 107M and a first electrode 107E. The second buried portion 108 may include a second barrier 108M and a second electrode 108E'. The first barrier 107M and the second barrier 108M may include titanium silicon nitride (TiSiN) or tantalum silicon nitride (TaSiN). The first barrier 107M may have a silicon content of 20 at % or less to have a high work function, and the second barrier 108M may have a silicon content of 30 at % or more to have a low work function. The first electrode 107E may include tungsten.

The second electrode 108E' may be a non-metallic conductive material, and may have a work function lower than the first barrier 107M. The second electrode 108E' may include polysilicon. The second electrode 108E' may include polysilicon doped with an N-type dopant, for example, N-type doped polysilicon (N-Poly Si). N-type doped polysilicon has a low work function.

According to the fourth embodiment, the first barrier 107M is a material which has a high work function, and the second barrier 108M is a material which has a low work function. The second electrode 108E' may be a low work function material.

As a consequence, a threshold voltage may be adjusted by the first barrier 107M. Gate-induced drain leakage (GIDL) may be improved by the second barrier 108M and the second electrode 108E'.

Figure 5B:
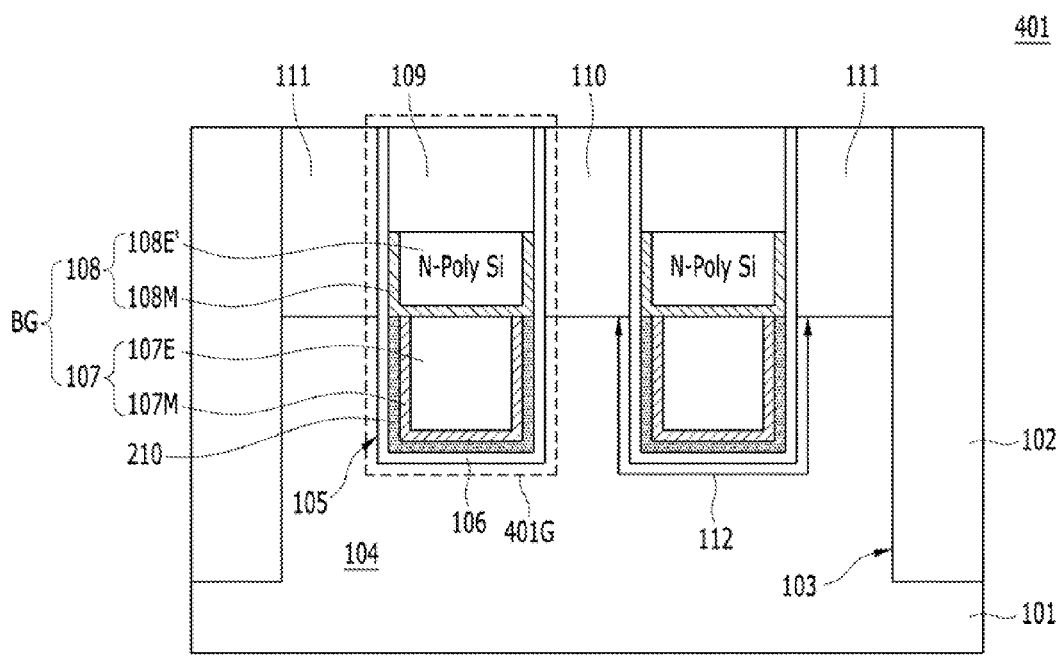
FIGS. 5B and 5C are views illustrating examples of semiconductor devices in accordance with modifications of the fourth embodiment.
Figure 5C:
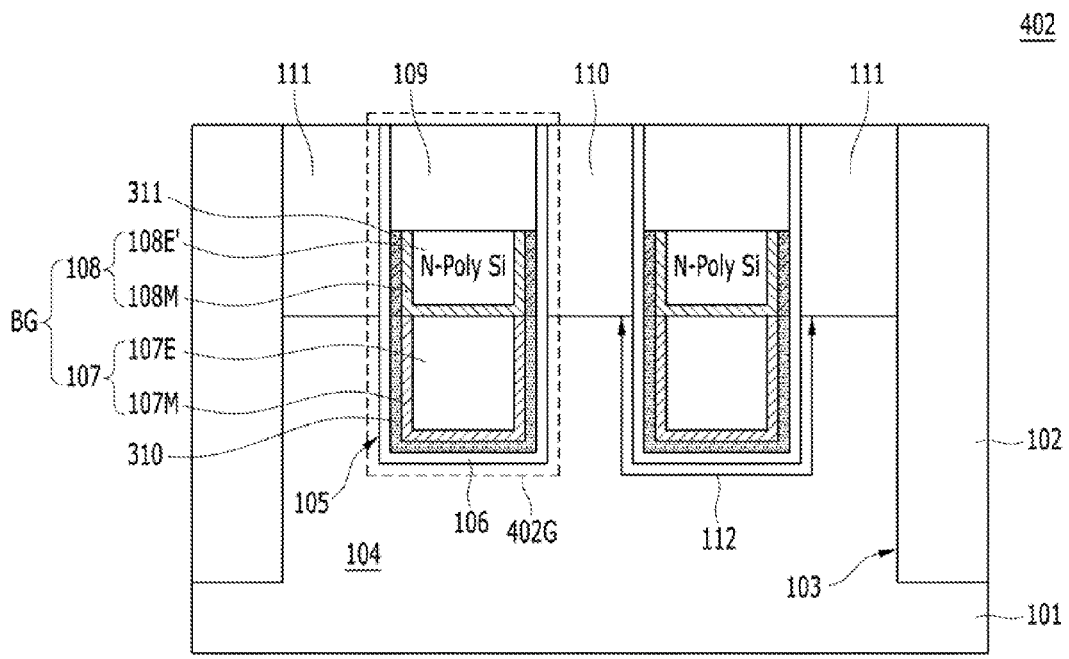

FIGS. 5B and 5C are views illustrating semiconductor devices 401, 402 in accordance with modifications of the fourth embodiment. In the semiconductor device 401 of FIG. 5B, the same components as those shown in the semiconductor device 200 of FIG. 3 are denoted with the same reference numerals. In the semiconductor device 402 of FIG. 5C, the same components as those shown in the semiconductor device 300 of FIG. 4 are denoted with the same reference numerals.

Referring to FIG. 5B, a buried gate structure 401G of the semiconductor device 401 may include a gate dielectric layer 106, a work function adjustment liner 210, a gate electrode BG, and a capping layer 109. The gate electrode BG may include a first buried portion 107 and a second buried portion 108. The first buried portion 107 may include a first barrier 107M and a first electrode 107E. The second buried portion 108 may include a second barrier 108M and a second electrode 108E'. The second electrode 108E' may include N-type doped polysilicon.

The work function adjustment liner 210 may be formed of metal oxide with a higher oxygen areal density. The work function adjustment liner 210 has a higher oxygen areal density than the gate dielectric layer 106. The work function adjustment liner 210 may include aluminum oxide, titanium oxide, hafnium oxide, zirconium oxide or magnesium oxide. The first barrier 107M and the second barrier 108M may include titanium silicon nitride (TiSiN) or tantalum silicon nitride (TaSiN). The first barrier 107M may have a silicon content of 20 at % or less to have a high work function, and the second barrier 108M may have a silicon content of 30 at % or more to have a low work function. The first electrode 107E may include tungsten.

As a consequence, a threshold voltage may be adjusted by the first barrier 107M and the work function adjustment liner 210. Gate-induced drain leakage (GIDL) may be improved by the second barrier 108M and the second electrode 108E'.

Referring to FIG. 5C, a buried gate structure 402G of the semiconductor device 402 may include a gate dielectric layer 106, a first work function adjustment liner 310, a gate electrode BG, a second work function adjustment liner 311, and a capping layer 109. The gate electrode BG may include a first buried portion 107 and a second buried portion 108. The first buried portion 107 may include a first barrier 107M and a first electrode 107E. The second buried portion 108 may include a second barrier 108M and a second electrode 108E'. The second electrode 108E' may include N-type doped polysilicon.

The first work function adjustment liner 310 may be formed of metal oxide with a higher oxygen areal density. The first work function adjustment liner 310 has a higher oxygen areal density than the gate dielectric layer 106. The first work function adjustment liner 310 may include aluminum oxide, titanium oxide, hafnium oxide, zirconium oxide or magnesium oxide. The second work function adjustment liner 311 may be formed of metal oxide with a lower oxygen areal density. The second work function adjustment liner 311 has a lower oxygen areal density than the gate dielectric layer 106. The second work function adjustment liner 311 may include yttrium oxide, lanthanum oxide, germanium oxide, lutetium oxide, or strontium oxide.

The first barrier 107M and the second barrier 108M may include titanium silicon nitride (TiSiN) or tantalum silicon nitride (TaSiN). The first barrier 107M may have a silicon content of 20 at % or less to have a high work function, and the second barrier 108M may have a silicon content of 30 at % or more to have a low work function. The first electrode 107E may include tungsten.

As a consequence, a threshold voltage may be adjusted by the first barrier 107M and the first work function adjustment liner 310. Gate-induced drain leakage (GIDL) may be improved by the second barrier 108M, the second electrode 108E' and the second work function adjustment liner 311. The buried gate structures 400G, 401G and 402G in accordance with the fourth embodiment and the modifications thereof may be applied to a buried gate type fin channel transistor as shown in FIG. 2A.

Figure 6A:
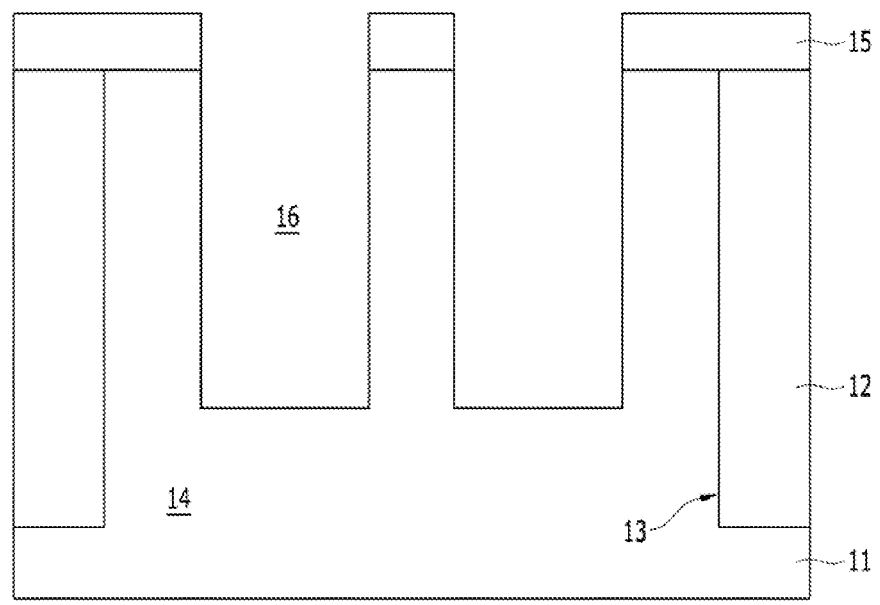
FIGS. 6A to 6F are examples illustrating a method for manufacturing the semiconductor device in accordance with the first embodiment.

FIGS. 6A to 6F illustrate a method for manufacturing the semiconductor device in accordance with the first embodiment. As shown in FIG. 6A, an isolation layer 12 is formed in a substrate 11. An active region 14 is defined by the isolation layer 12. The isolation layer 12 may be formed through a shallow trench isolation (STI) process. For example, by etching the substrate 11, an isolation trench 13 is formed. The isolation trench 13 is filled with a dielectric material, and accordingly, the isolation layer 12 is formed. The isolation layer 12 may include silicon oxide, silicon nitride, or a combination thereof. Chemical vapor deposition (CVD) or another deposition process may be used to fill the isolation trench 13 with a dielectric material. A planarization process such as chemical mechanical polishing (CMP) may be additionally used.

A gate trench 16 is formed in the substrate 11. The gate trench 16 may be formed to have a line shape which traverses the active region 14 and the isolation layer 12. The gate trench 16 may be formed by an etching process using a hard mask 15 as an etch mask. The hard mask 15 may be formed on the substrate 11, and may have a line-shaped opening. The hard mask 15 may be formed of a material which has an etching selectivity with respect to the substrate 11. The hard mask 15 may be silicon oxide such as tetra-ethyl-ortho-silicate (TEOS). The gate trench 16 may be formed shallower than the isolation trench 13. The gate trench 16 may have a sufficient depth capable of increasing the average cross-sectional area of a gate electrode to be subsequently formed. According to this fact, the resistivity of the gate electrode may be reduced.

The bottom of the gate trench 16 may have a curvature or may be round. In this way, by forming the bottom of the gate trench 16 to have a curvature, a roughness may be minimized at the bottom of the gate trench 16, and accordingly, filling of the gate electrode may be easily performed. Also, by forming the bottom of the gate trench 16 to have a curvature, angled corners may be removed at the bottom of the gate trench 16, whereby electric field concentration may be reduced.

Subsequently, while not shown, the fin region 104F shown in FIGS. 2A and 2B may be formed. In order to form the fin region 104F, the isolation layer 12 under the gate trench 16 may be recessed.

Figure 6B:
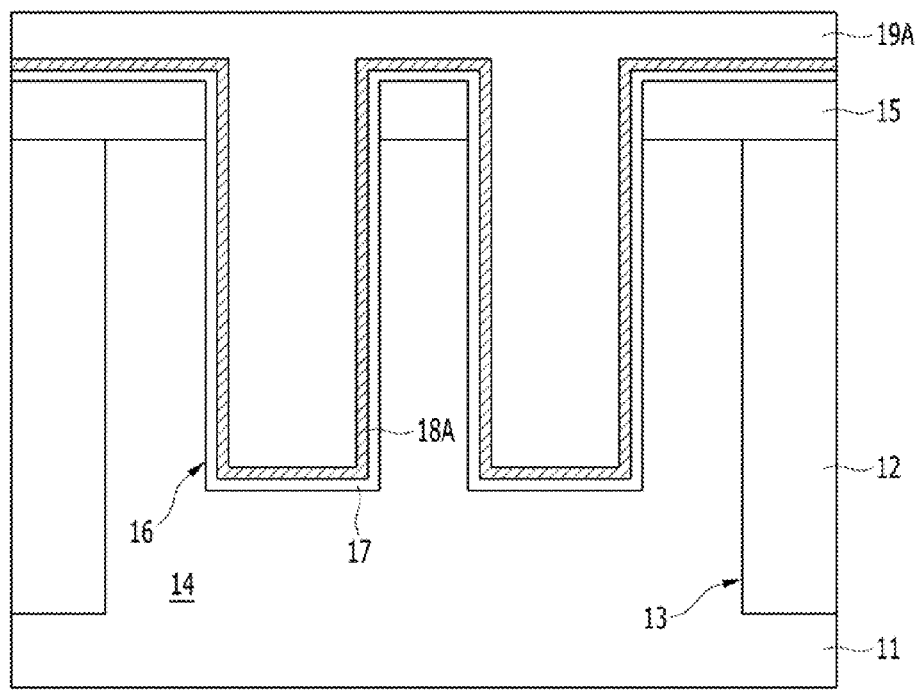

As shown in FIG. 6B, a gate dielectric layer 17 may be formed on the surfaces of the gate trench 16 and the hard mask 15. Before forming the gate dielectric layer 17, etch damage to the surface of the gate trench 16 may be recovered. For example, sacrificial oxide may be formed by thermal oxidation processing and may then be removed.

The gate dielectric layer 17 may be formed through a thermal oxidation process. In another embodiment, the gate dielectric layer 17 may be formed by chemical vapor deposition (CVD) or atomic layer deposition (ALD). The gate dielectric layer 17 may include a high-k material, oxide, nitride, oxynitride, or a combination thereof. The high-k material may include a hafnium-containing material. The hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, or a combination thereof. Any conventional high-k materials known in the art may be used as the high-k material.

A first barrier layer 18A may be formed on the gate dielectric layer 17. The first barrier layer 18A may be formed conformally on the surface of the gate dielectric layer 17. The first barrier layer 18A may include titanium silicon nitride of which a silicon content is adjusted. Alternatively, the first barrier layer 18A may include tantalum silicon nitride of which a silicon content is adjusted. The silicon content in the first barrier layer 18A may be 20 at % or less. Accordingly, the first barrier layer 18A may have a high work function. The first barrier layer 18A may be formed using atomic layer deposition (ALD) or chemical vapor deposition (CVD).

A first electrode layer 19A may be formed on the first barrier layer 18A. The first electrode layer 19A may fill the gate trench 16. The first electrode layer 19A includes a low resistivity metallic material. The first electrode layer 19A may include tungsten. The first electrode layer 19A may be formed by chemical vapor deposition (CVD) or atomic layer deposition (ALD).

Figure 6C:
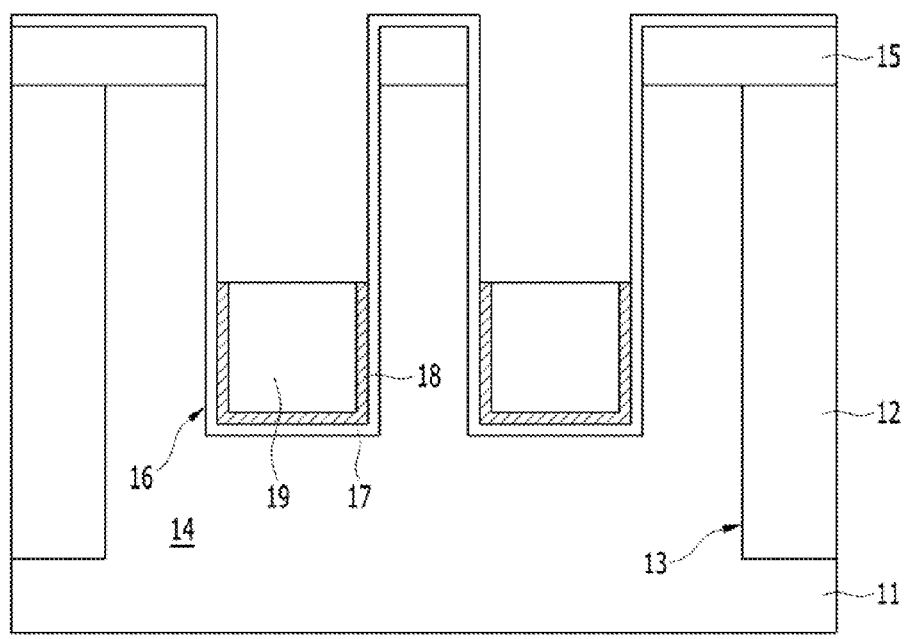

As shown in FIG. 6C, a first recessing process is performed such that a first barrier 18 and a first electrode 19 are formed in the gate trench 16. The first recessing process may be performed by dry etching, for example, an etch-back process. The first barrier 18 is formed by the etch-back process of the first barrier layer 18A. The first electrode 19 is formed by the etch-back process of the first electrode layer 19A. In another embodiment, the first recessing process may be performed after a planarization process performed to expose the hard mask 15. The heights of the top surfaces of the first barrier 18 and the first electrode 19 may be at the same level.

By the above-described first recessing process, the top surfaces of the first barrier 18 and the first electrode 19 may be recessed and located at a lower level than the top surface of the active region 14.

Figure 6D:
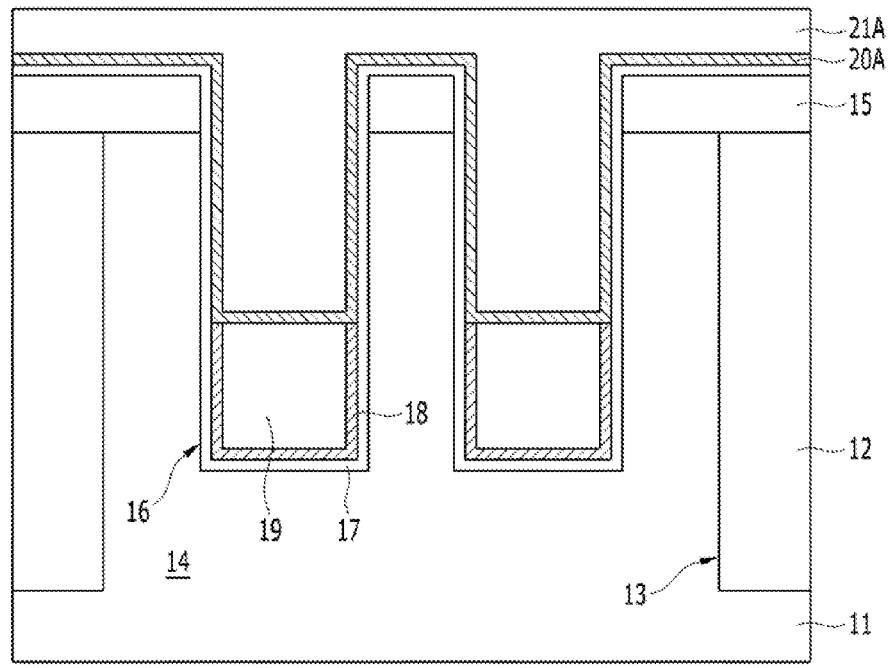

As shown in FIG. 6D, a second barrier layer 20A may be formed on the first barrier 18 and the first electrode 19. The second barrier layer 20A may be formed conformally. The second barrier layer 20A may include titanium silicon nitride of which a silicon content is adjusted. Alternatively, the second barrier layer 20A may include tantalum silicon nitride of which a silicon content is adjusted. The silicon content in the second barrier layer 20A may be 30 at % or more. Accordingly, the second barrier layer 20A may have a low work function. The second barrier layer 20A may be formed using atomic layer deposition (ALD) or chemical vapor deposition (CVD).

A second electrode layer 21A may be formed on the second barrier layer 20A. The second electrode layer 21A may fill the gate trench 16. The second electrode layer 21A includes a low resistivity metallic material. The second electrode layer 21A may include tungsten. The second electrode layer 21A may be formed by chemical vapor deposition (CVD) or atomic layer deposition (ALD). In another embodiment, the second electrode layer 21A may include a low work function material. For example, the second electrode layer 21A may include N-type doped polysilicon.

Figure 6E:
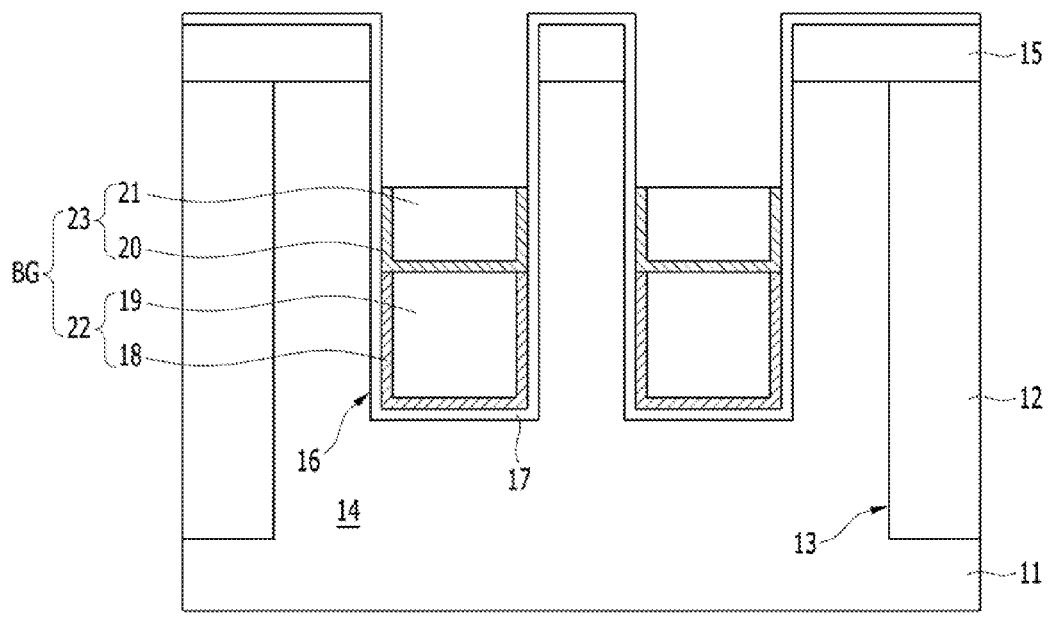

As shown in FIG. 6E, a second recessing process is performed such that a second barrier 20 and a second electrode 21 are formed in the gate trench 16. The second recessing process may be performed by dry etching, for example, an etch-back process. The second barrier 20 is formed by the etch-back process of the second barrier layer 20A. The second electrode 21 is formed by the etch-back process of the second electrode layer 21A. In another embodiment, the second recessing process may be performed after a planarization process is first performed to expose the hard mask 15. The heights of the top surfaces of the second barrier 20 and the second electrode 21 may be at the same level. The top surfaces of the second barrier 20 and the second electrode 21 may be recessed and be located at a lower level than the top surface of the active region 14.

By the above-described second recessing process, a gate electrode BG may be formed. The gate electrode BG may include a first buried portion 22 and a second buried portion 23. The first buried portion 22 may include the first barrier 18 and the first electrode 19. The second buried portion 23 may include the second barrier 20 and the second electrode 21.

Figure 6F:
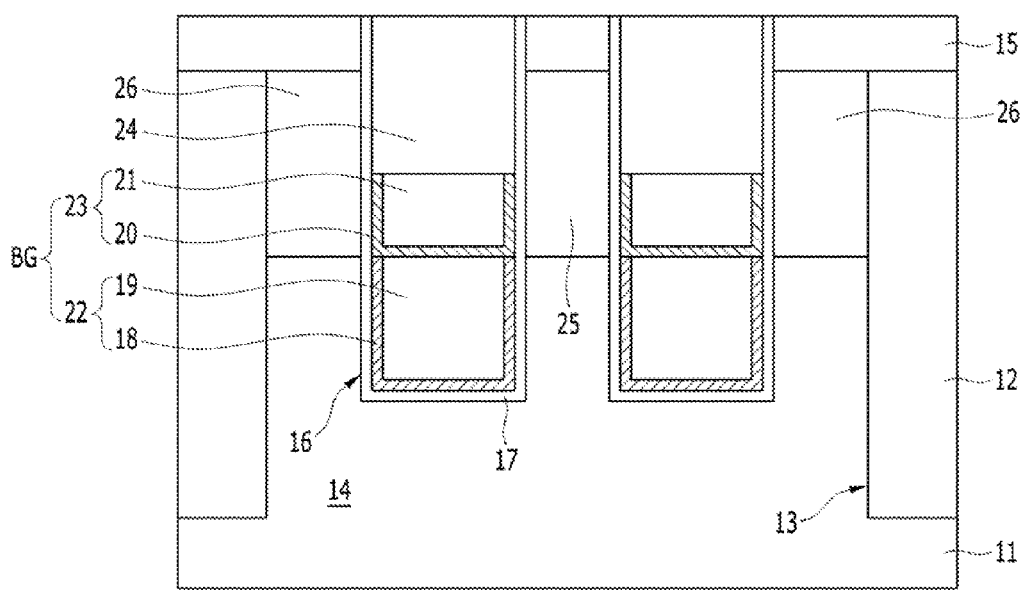

As shown in FIG. 6F, a capping layer 24 is formed on the second barrier 20 and the second electrode 21. The capping layer 24 includes a dielectric material. The capping layer 24 may include silicon nitride. Subsequently, planarization of the capping layer 24 may be performed such that the top surface of the hard mask 15 is exposed. During or after the planarization process of the capping layer 24, the gate dielectric layer 17 on the top surface of the hard mask 15 may be removed. The capping layer 24 may be an oxide-nitride-oxide (ONO) structure.

By the above-described series of processes, a buried gate structure is formed. The buried gate structure includes the gate dielectric layer 17, the gate electrode BG, and the capping layer 24. The gate electrode BG includes the first barrier 18, the first electrode 19, the second barrier 20, and the second electrode 21. The top surface of the gate electrode BG is positioned at a lower level than the top surface of the substrate 11. In this way, as the top surface of the gate electrode BG is recessed, the physical distance between the gate electrode BG and a nearby conductor (for example, a contact plug) may be sufficiently secured. As a result, a withstand-voltage between the gate electrode BG and a nearby conductor may be improved.

After forming the capping layer 24, a doping process of an impurity is performed by implantation or another doping technology. Accordingly, a first doping region 25 and a second doping region 26 are formed in the substrate 11. The first doping region 25 and the second doping region 26 may be referred to as a source region and a drain region, respectively. Each of the first doping region 25 and the second doping region 26 may have a depth that overlaps with the second buried portion 23. Accordingly, the second barrier 20 may overlap with the first and second doping regions 25 and 26. The first barrier 18 may not overlap with the first and second doping regions 25 and 26.

In another embodiment, the first doping region 25 and the second doping region 26 may be formed before forming the gate trench 16. For example, after forming a doping region by doping an impurity into the active region 14 using an ion implantation mask, the gate trench 16 may be formed. At this time, the doping region may be divided into the first doping region 25 and the second doping region 26 by the gate trench 16.

FIGS. 7A to 7E illustrate a method for forming the semiconductor device in accordance with the second embodiment. The method for forming the semiconductor device in accordance with the second embodiment may be the same as the method shown in FIGS. 6A to 6F, except that a work function adjustment liner 31A which induces a high work function may be additionally formed.

Figure 7A:
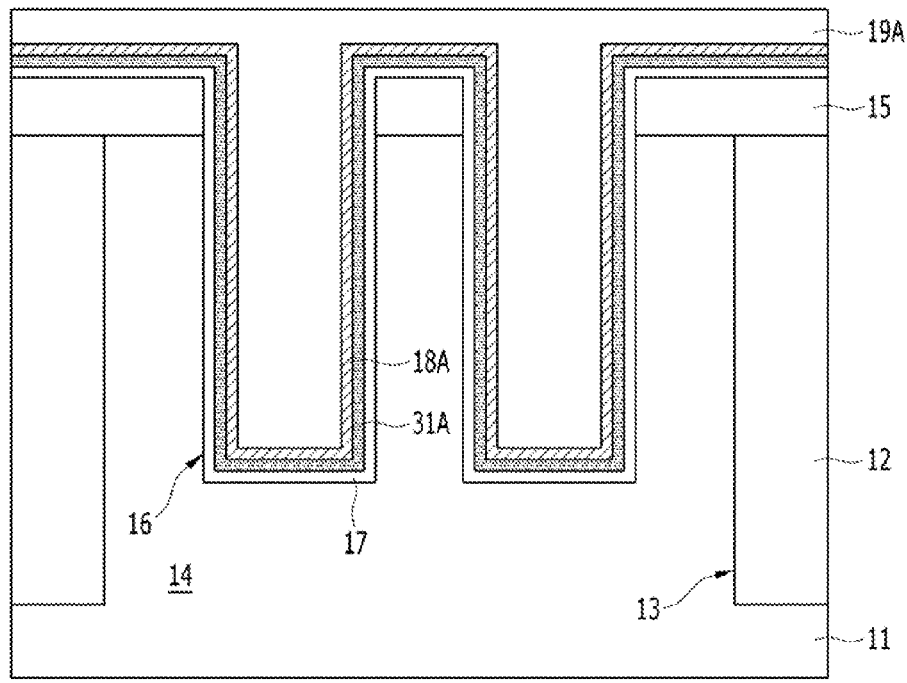
FIGS. 7A to 7E are examples illustrating a method for forming the semiconductor device in accordance with the second embodiment.

As shown in FIG. 7A, an isolation layer 12 and an active region 14 are formed in a substrate 11. The isolation layer 12 may fill an isolation trench 13.

A gate trench 16 is formed in the substrate 11. The gate trench 16 may be formed to have a line shape which traverses the active region 14 and the isolation layer 12. The gate trench 16 may be formed by an etching process using a hard mask 15 as an etch mask. Subsequently, while not shown, a fin region may be formed. In order to form the fin region, the isolation layer 12 under the gate trench 16 may be recessed.

A gate dielectric layer 17 may be formed on the surfaces of the gate trench 16 and the hard mask 15. The gate dielectric layer 17 may be formed by a thermal oxidation process. In another embodiment, the gate dielectric layer 17 may be formed by chemical vapor deposition (CVD) or atomic layer deposition (ALD). The gate dielectric layer 17 may include a high-k material, silicon oxide, silicon nitride, silicon oxynitride, or a combination thereof.

The work function adjustment liner layer 31A may be formed on the gate dielectric layer 17. The work function adjustment liner layer 31A may be formed conformally on the gate dielectric layer 17. The work function adjustment liner layer 31A may be formed of metal oxide with a higher oxygen areal density. The work function adjustment liner layer 31A has a higher oxygen areal density than the gate dielectric layer 17. In the case where the gate dielectric layer 17 is $SiO_2$, the work function adjustment liner layer 31A may include aluminum oxide, titanium oxide, hafnium oxide, zirconium oxide, or magnesium oxide.

A first barrier layer 18A may be formed on the work function adjustment liner layer 31A. The first barrier layer 18A may be formed conformally on the surface of the work function adjustment liner layer 31A. The first barrier layer 18A may include titanium silicon nitride with an adjusted silicon content. Alternatively, the first barrier layer 18A may include tantalum silicon nitride of which a silicon content is adjusted. The silicon content of the first barrier layer 18A may be 20 at % or less. Accordingly, the first barrier layer 18A may have a high work function. The first barrier layer 18A may be formed using atomic layer deposition (ALD) or chemical vapor deposition (CVD).

A first electrode layer 19A may be formed on the first barrier layer 18A. The first electrode layer 19A may fill the gate trench 16. The first electrode layer 19A includes a low resistivity metallic material. The first electrode layer 19A may include tungsten. The first electrode layer 19A may be formed by chemical vapor deposition (CVD) or atomic layer deposition (ALD).

Figure 7B:
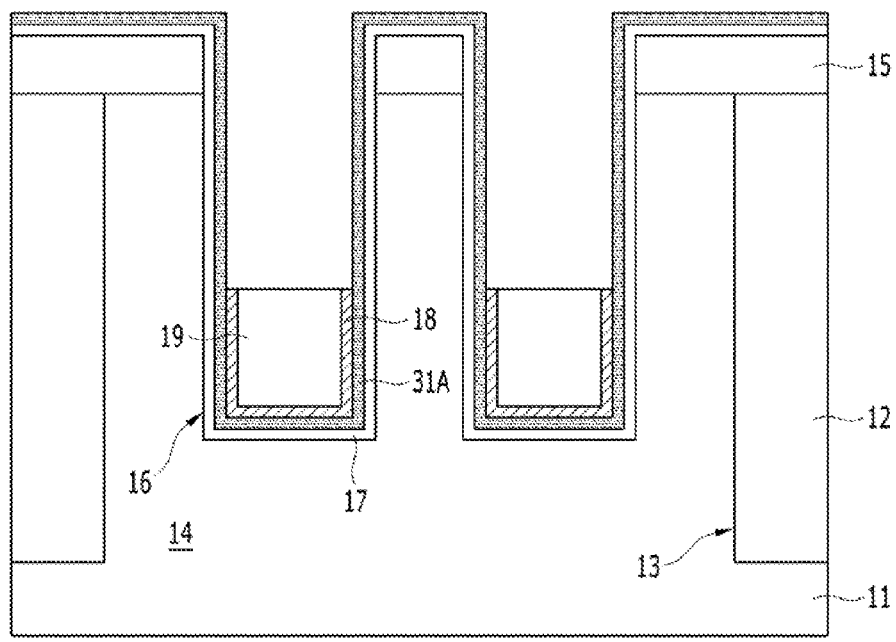

As shown in FIG. 7B, a first recessing process is performed such that a first barrier 18 and a first electrode 19 are formed in the gate trench 16. The first recessing process may be performed by dry etching, for example, an etch-back process. The first barrier 18 is formed by the etch-back process of the first barrier layer 18A. The first electrode 19 is formed by the etch-back process of the first electrode layer 19A. In another embodiment, the first recessing process may be performed after a planarization process is first performed to expose the hard mask 15. The top surfaces of the first barrier 18 and the first electrode 19 may be at the same level. During the first recessing process, the gate dielectric layer 17 may be protected by the work function adjustment liner layer 31A. According to this fact, it is possible to substantially prevent the gate dielectric layer 17 from being damaged. The gate dielectric layer 17 contacts first and second doping regions which will be subsequently formed.

By the above-described first recessing process, the top surfaces of the first barrier 18 and the first electrode 19 may be recessed to be lower than the top surface of the active region 14.

Figure 7C:
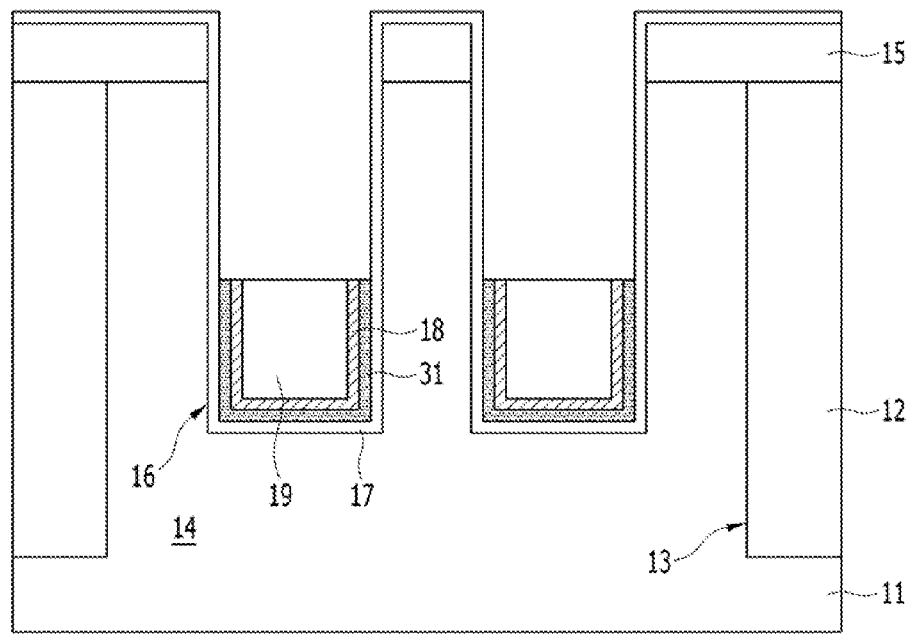

As shown in FIG. 7C, a recessing process is performed such that a work function adjustment liner 31 is formed in the gate trench 16. That is to say, the work function adjustment liner 31 may be formed by recessing the work function adjustment liner layer 31A. The top surface of the work function adjustment liner 31 may be at the same level as the first barrier 18 and the first electrode 19. The work function adjustment liner 31 may be positioned between the first barrier 18 and the gate dielectric layer 17.

Figure 7D:
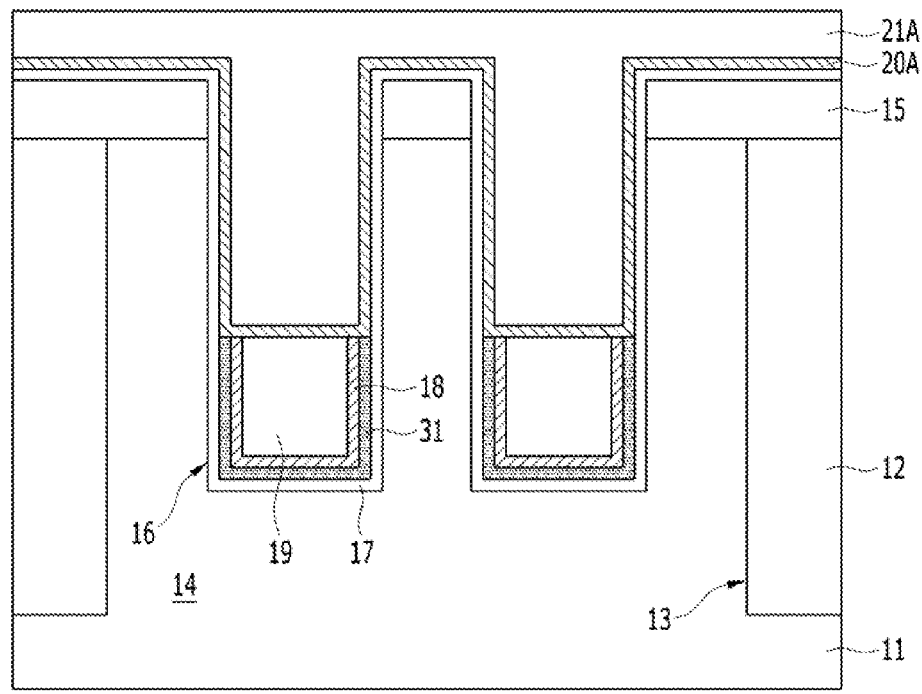

As shown in FIG. 7D, a second barrier layer 20A may be formed on the work function adjustment liner 31, the first barrier 18 and the first electrode 19. The second barrier layer 20A may be formed conformally. The second barrier layer 20A may include titanium silicon nitride of which a silicon content is adjusted. Alternatively, the second barrier layer 20A may include tantalum silicon nitride of which a silicon content is adjusted. The silicon content of the second barrier layer 20A may be 30 at % or over. Accordingly, the second barrier layer 20A may have a low work function. The second barrier layer 20A may be formed using atomic layer deposition (ALD) or chemical vapor deposition (CVD).

A second electrode layer 21A may be formed on the second barrier layer 20A. The second electrode layer 21A may fill the gate trench 16. The second electrode layer 21A includes a low resistivity metallic material. The second electrode layer 21A may include tungsten. The second electrode layer 21A may be formed by chemical vapor deposition (CVD) or atomic layer deposition (ALD). In another embodiment, the second electrode layer 21A may include a low work function material. For example, the second electrode layer 21A may include N-type doped polysilicon.

Figure 7E:
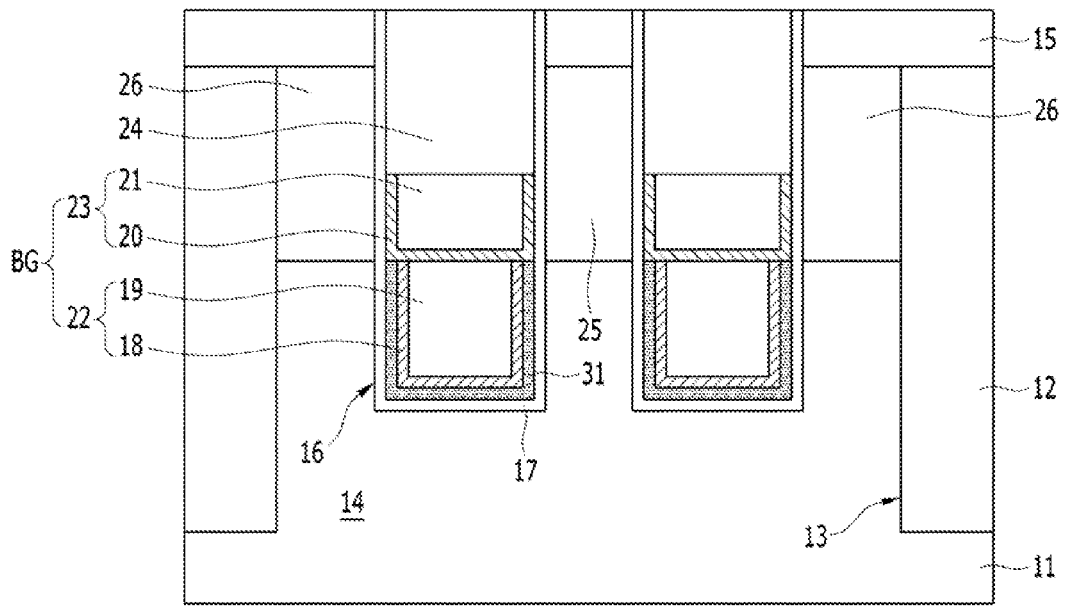

As shown in FIG. 7E, a second recessing process is performed such that a second barrier 20 and a second electrode 21 are formed in the gate trench 16. The second recessing process may be performed by dry etching, for example, an etch-back process. The second barrier 20 is formed by the etch-back process of the second barrier layer 20A shown in FIG. 7D. The second electrode 21 is formed by the etch-back process of the second electrode layer 21A shown in FIG. 7D. In another embodiment, the second recessing process may be performed after a planarization process is first performed to expose the hard mask 15.

The top surfaces of the second barrier 20 and the second electrode 21 may be at the same level. The top surfaces of the second barrier 20 and the second electrode 21 may be recessed and be located at lower level than the top surface of the active region 14. By the second recessing process, a gate electrode BG may be formed. The gate electrode BG may include a first buried portion 22 and a second buried portion 23. The first buried portion 22 may include the first barrier 18 and the first electrode 19. The second buried portion 23 may include the second barrier 20 and the second electrode 21.

A capping layer 24 is formed on the second barrier 20 and the second electrode 21. The capping layer 24 includes a dielectric material. The capping layer 24 may include silicon nitride. Subsequently, planarization of the capping layer 24 may be performed such that the top surface of the hard mask 15 is exposed. During or after the planarization process of the capping layer 24, the gate dielectric layer 17 on the top surface of the hard mask 15 may be removed. The capping layer 24 may be an oxide-nitride-oxide ONO structure.

By the above-described series of processes, a buried gate structure is formed. The buried gate structure includes the gate dielectric layer 17, the work function adjustment liner 31, the gate electrode BG, and the capping layer 24. The gate electrode BG includes the first barrier 18, the first electrode 19, the second barrier 20, and the second electrode 21. The top surface of the gate electrode BG is positioned lower than the top surface of the substrate 11.

After forming the capping layer 24, a doping process of an impurity is performed by implantation or another doping technology. Accordingly, a first doping region 25 and a second doping region 26 are formed in the substrate 11. The first doping region 25 and the second doping region 26 may be referred to as a source region and a drain region, respectively. The first doping region 25 and the second doping region 26 may have a depth that overlaps with the second buried portion 23. Accordingly, the second barrier 20 may overlap with the first and second doping regions 25 and 26. The first barrier 18 and the work function adjustment liner 31 may not overlap with the first and second doping regions 25 and 26.

In another embodiment, the first doping region 25 and the second doping region 26 may be formed before forming the gate trench 16. For example, after forming a doping region by doping an impurity into the active region 14 using an ion implantation mask, the gate trench 16 may be formed. At this time, the doping region may be divided into the first doping region 25 and the second doping region 26 by the gate trench 16.

FIGS. 8A to 8E illustrate a method for forming the semiconductor device in accordance with the third embodiment. The method for forming the semiconductor device in accordance with the third embodiment may be the same as the method shown in FIGS. 7A to 7E, except that a second work function adjustment liner 41 which induces a low work function may be additionally formed before forming a second buried portion.

First, by the series of processes according to FIGS. 7A to 7C, the work function adjustment liner 31, the first barrier 18 and the first electrode 19 are formed. Hereinbelow, the work function adjustment liner 31 will be referred to as a first work function adjustment liner 31. The first work function adjustment liner 31 and the gate dielectric layer 17 may form a dipole which induces a high work function.

Figure 8A:
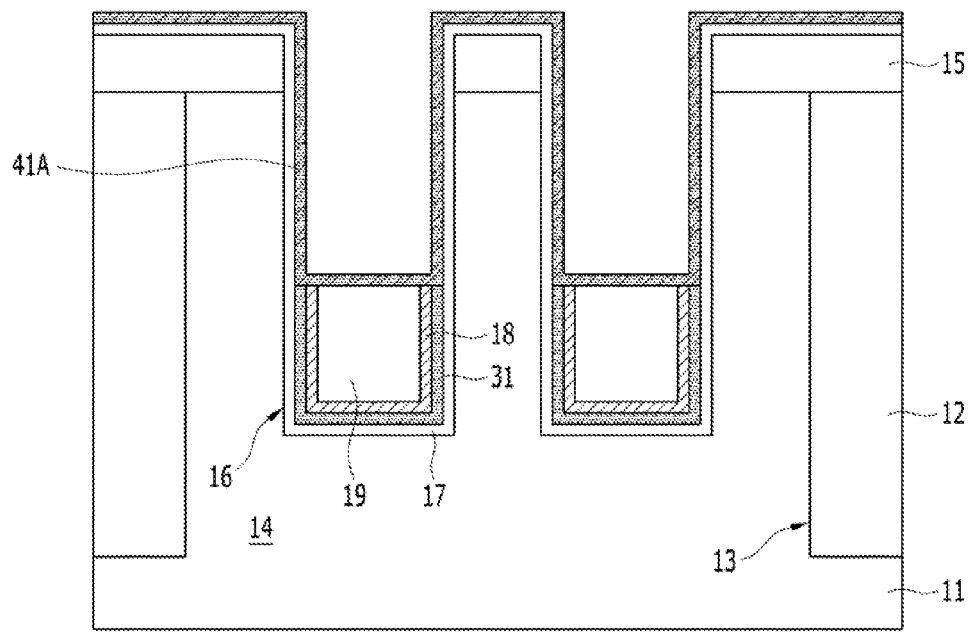
FIGS. 8A to 8E are examples illustrating a method for forming the semiconductor device in accordance with the third embodiment.

Next, as shown in FIG. 8A, a second work function adjustment liner layer 41A may be formed on the first work function adjustment liner 31, the first barrier 18 and the first electrode 19. The second work function adjustment liner layer 41A may be formed conformally. The second work function adjustment liner layer 41A may be formed of metal oxide with a lower oxygen areal density. The second work function adjustment liner layer 41A has a lower oxygen areal density than the gate dielectric layer 17. In the case where the gate dielectric layer 17 is $SiO_2$, the second work function adjustment liner layer 41A may include yttrium oxide, lanthanum oxide, germanium oxide, lutetium oxide, or strontium oxide.

Figure 8B:
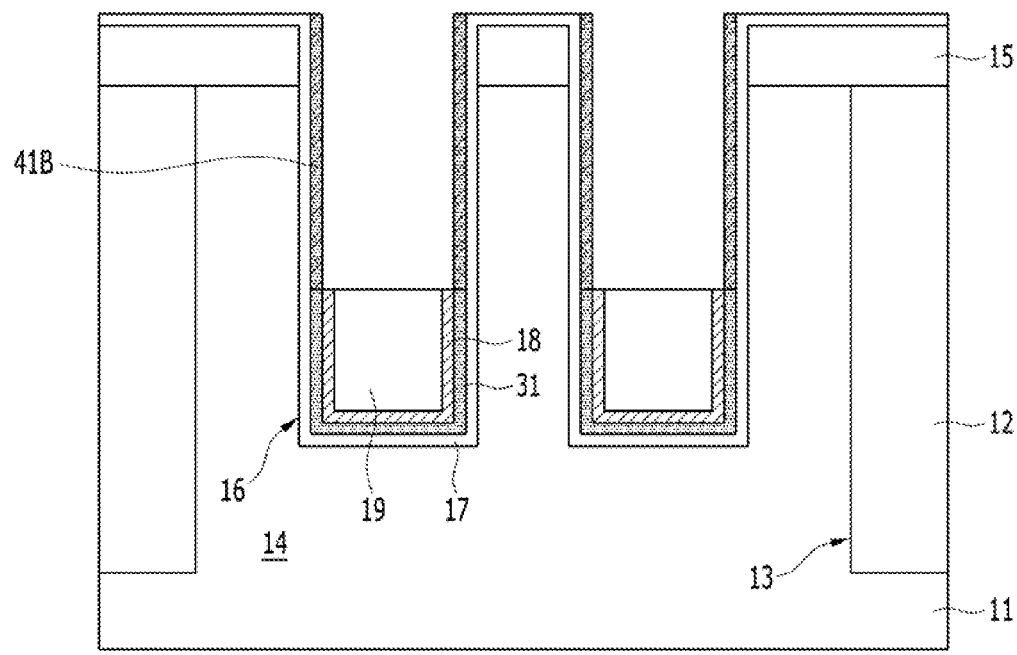

As shown in FIG. 8B, in order to form a pre-second work function adjustment liner 41B, an etch-back process may be performed. In other words, the second work function adjustment liner layer 41A may be etched back. Accordingly, the pre-second work function adjustment liner 41B which has a spacer shape may be formed. The bottom surface of the pre-second work function adjustment liner 41B may contact the top surface of the first work function adjustment liner 31.

Figure 8C:
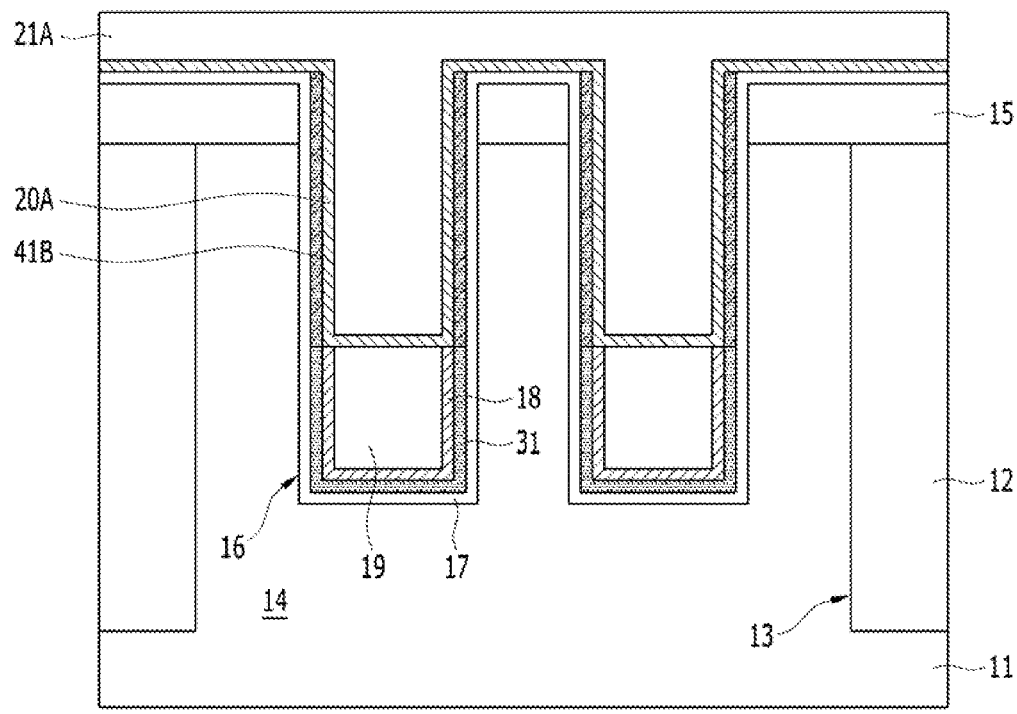

As shown in FIG. 8C, a second barrier layer 20A may be formed. The second barrier layer 20A may be formed to cover the pre-second work function adjustment liner 41B, the first barrier 18 and the first electrode 19. The second barrier layer 20A may be formed conformally. The second barrier layer 20A may include titanium silicon nitride with an adjusted silicon content. Alternatively, the second barrier layer 20A may include tantalum silicon nitride with an adjusted silicon content. The silicon content of the second barrier layer 20A may be 30 at % or more. Accordingly, the second barrier layer 20A may have a low work function. The second barrier layer 20A may be formed using atomic layer deposition (ALD) or chemical vapor deposition (CVD).

A second electrode layer 21A may be formed on the second barrier layer 20A. The second electrode layer 21A may fill the gate trench 16. The second electrode layer 21A includes a low resistivity metallic material. The second electrode layer 21A may include tungsten. The second electrode layer 21A may be formed by chemical vapor deposition (CVD) or atomic layer deposition (ALD). In another embodiment, the second electrode layer 21A may include a low work function material. For example, the second electrode layer 21A may include N-type doped polysilicon.

Figure 8D:
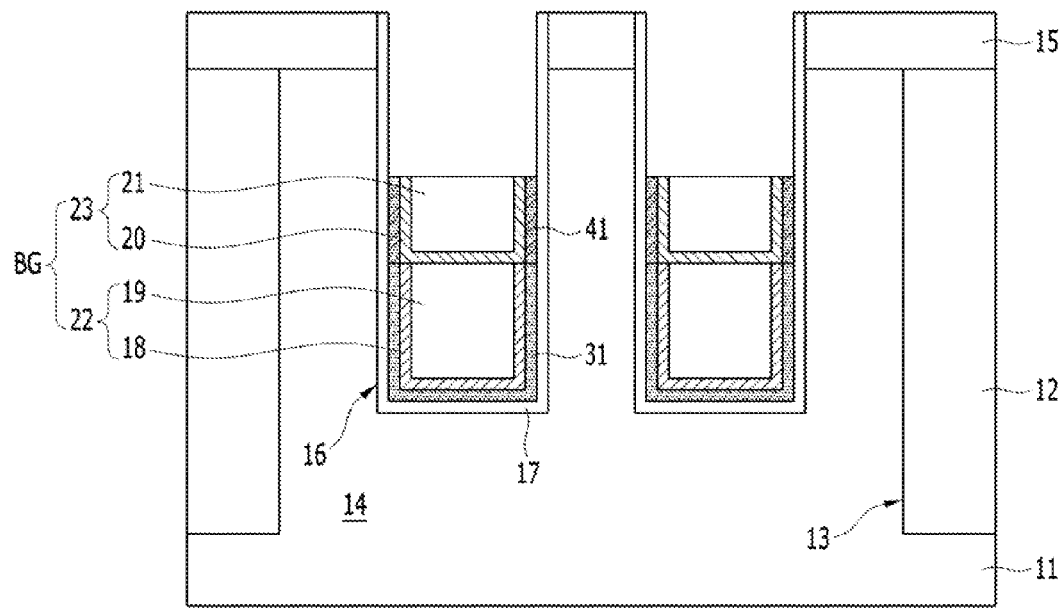

As shown in FIG. 8D, a second recessing process is performed such that a second barrier 20 and a second electrode 21 are formed in the gate trench 16. The second recessing process may be performed by dry etching, for example, an etch-back process. The second barrier 20 is formed by the etch-back process of the second barrier layer 20A. The second electrode 21 is formed by the etch-back process of the second electrode layer 21A. In another embodiment, the second recessing process may be performed after a planarization process is first performed to expose the hard mask 15.

The top surfaces of the second barrier 20 and the second electrode 21 may be at the same level. The top surfaces of the second barrier 20 and the second electrode 21 may be recessed and be located at a lower level than the top surface of the active region 14. By the second recessing process, a gate electrode BG may be formed. The gate electrode BG may include a first buried portion 22 and a second buried portion 23. The first buried portion 22 may include the first barrier 18 and the first electrode 19. The second buried portion 23 may include the second barrier 20 and the second electrode 21.

In order to form a second work function adjustment liner 41, the pre-second work function adjustment liner 41B may be etched back. The top surface of the second work function adjustment liner 41 may be at the same level as top surfaces of the second barrier 20 and the second electrode 21.

Figure 8E:
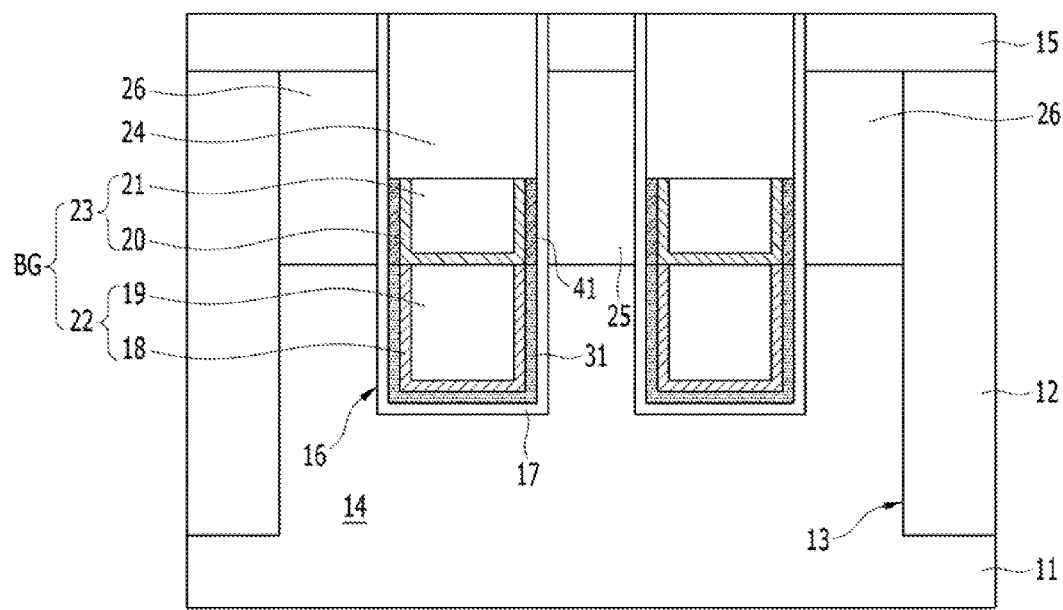

As shown in FIG. 8E, a capping layer 24 is formed on the second work function adjustment liner 41, the second barrier 20 and the second electrode 21. The capping layer 24 includes a dielectric material. The capping layer 24 may include silicon nitride. Subsequently, planarization of the capping layer 24 may be performed such that the top surface of the hard mask 15 is exposed. During or after the planarization process of the capping layer 24, the gate dielectric layer 17 on the top surface of the hard mask 15 may be removed. The capping layer 24 may be an oxide-nitride-oxide (ONO) structure.

By the above-described series of processes, a buried gate structure is formed. The buried gate structure includes the gate dielectric layer 17, the first work function adjustment liner 31, the gate electrode BG, the second work function adjustment liner 41, and the capping layer 24. The gate electrode BG includes the first barrier 18, the first electrode 19, the second barrier 20, and the second electrode 21. The top surface of the gate electrode BG is positioned at a lower level than the top surface of the substrate 11. The first work function adjustment liner 31 may be positioned between the first barrier 18 and the gate dielectric layer 17. The second work function adjustment liner 41 may be positioned between the second barrier 20 and the gate dielectric layer 17.

After forming the capping layer 24, a doping process of an impurity is performed by implantation or another doping technology. According to this fact, a first doping region 25 and a second doping region 26 are formed in the substrate 11. The first doping region 25 and the second doping region 26 may be referred to as a source region and a drain region, respectively. The first doping region 25 and the second doping region 26 may have a depth that overlaps with the second buried portion 23. Accordingly, the second barrier 20 and the second work function adjustment liner 41 may overlap with the first and second doping regions 25 and 26. The first barrier 18 and the first work function adjustment liner 31 may not overlap with the first and second doping regions 25 and 26.

In another embodiment, the first doping region 25 and the second doping region 26 may be formed before forming the gate trench 16. For example, after forming a doping region by doping an impurity into the active region 14 using an ion implantation mask, the gate trench 16 may be formed. At this time, the doping region may be divided into the first doping region 25 and the second doping region 26 by the gate trench 16.

The semiconductor devices according to the above-described embodiments may be applied to a dynamic random access memory (DRAM), but are not limited thereto. The semiconductor devices according to the above-described embodiments may also be applied to a memory such as an static random access memory (SRAM), a flash memory, an ferroelectric random access memory (FeRAM), an magnetic random access memory (MRAM), a phase change random access memory (PRAM), etc.

Figure 9:
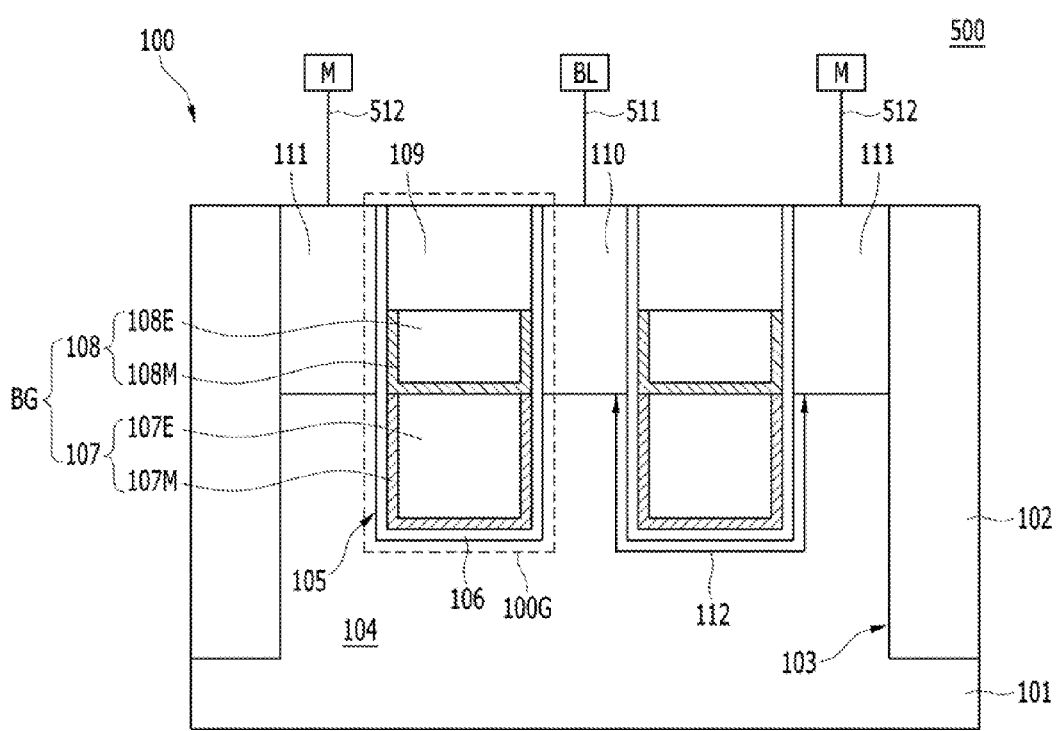
FIG. 9 is an example of a memory cell including the semiconductor device in accordance with the embodiments.

FIG. 9 illustrates a memory cell including the semiconductor device in accordance with the embodiments. Referring to FIG. 9, a memory cell 500 is shown. The memory cell 500 may include a transistor 100, a bit line BL, and a memory element M. The transistor 100 may be the same as the semiconductor device 100 of FIG. 1. Accordingly, the transistor 100 may include a buried gate structure 100G, a first doping region 110, and a second doping region 111. The buried gate structure 100G may be formed in a gate trench 105. The buried gate structure 100G may include a gate dielectric layer 106, a gate electrode BG, and a capping layer 109.

The gate electrode BG may include a first buried portion 107 and a second buried portion 108. The first buried portion 107 may include a first barrier 107M and a first electrode 107E. The second buried portion 108 may include a second barrier 108M and a second electrode 108E. The first doping region 110 may be electrically coupled to the bit line BL through a first contact plug 511. The second doping region 111 may be electrically coupled to the memory element M through a second contact plug 512. The memory element M may include a capacitor. The buried gate structure 100G may be referred to as a buried word line structure (BWL).

The transistor 100 may be replaced with the semiconductor devices according to the second embodiment, the third embodiment, the fourth embodiment and the modifications of the fourth embodiment.

As described above, the buried gate structure 100G of the memory cell 500 includes the first barrier 107M which has a high work function and the second barrier 108M which has a low work function. Accordingly, refresh characteristics may be improved.

In the embodiments, by using a flat-band voltage shift by a barrier having a high work function, it is possible to easily adjust a threshold voltage. Further, by the barrier of a high work function, a channel dose may be decreased, and junction leakage may be reduced.

Moreover, in the embodiments, since a low work function material or a dipole being capable of making a change to a low work function is formed between a gate electrode and a source region/a drain region, gate-induced drain leakage (GIDL) may be reduced.

Although various embodiments have been described for illustrative purposes, it will be apparent to those skilled in the art that various changes and modifications may be made without departing from the spirit and scope of the invention as defined in the following claims.

What is claimed is:
1. A semiconductor device comprising:
a substrate including a trench;
a gate dielectric layer formed over a surface of the trench;
a gate electrode positioned in the trench and at a level lower than a top surface of the substrate, wherein the gate electrode includes a first buried portion and a second buried portion, wherein the second buried portion is formed over the first buried portion; and
a first doping region and a second doping region formed in the substrate and over first and second sides of the gate electrode, wherein each of the first doping region and the second doping region overlaps the second buried portion,
wherein the first buried portion includes a first barrier with a first work function,
wherein the second buried portion includes second barrier with a second work function,
wherein the second work function is lower than the first work function,
wherein the first barrier includes metal silicon nitride with 20 atomic percent or less of silicon and the second barrier includes metal silicon nitride with 30 atomic percent or more of silicon.

2. The semiconductor device according to claim 1, wherein the first barrier has a work function higher than a mid-gap work function of silicon, and
wherein the second barrier has a work function lower than the mid-gap work function of silicon.

3. The semiconductor device according to claim 1, wherein the first barrier includes titanium silicon nitride with 20 atomic percent or less of silicon, and
wherein the second barrier includes titanium silicon nitride with 30 atomic percent or more of silicon.

4. The semiconductor device according to claim 1, wherein the first barrier includes tantalum silicon nitride with 20 atomic percent or less of silicon, and
wherein the second barrier includes tantalum silicon nitride with 30 atomic percent or more of silicon.

5. The semiconductor device according to claim 1, wherein the first buried portion further includes a first electrode,
wherein the first electrode includes a metal-containing material, and
wherein the first barrier is positioned between the first electrode and the gate dielectric layer.

6. The semiconductor device according to claim 1, wherein the second buried portion further includes a second electrode,
wherein the second electrode includes a metal-containing material or N-type doped polysilicon, and
wherein the second barrier is positioned between the second electrode and the gate dielectric layer.

7. A semiconductor device comprising:
a substrate including a trench;
a gate dielectric layer formed over a surface of the trench;
a gate electrode positioned in the trench and at a level lower than a top surface of the substrate, wherein the gate electrode includes a first buried portion and a second buried portion, wherein the second buried portion is formed over the first buried portion;
a first doping region and a second doping region each formed in the substrate and respectively over first and second sides of the gate electrode, wherein each of the first doping region and the second doping region overlaps the second buried portion; and
a work function adjustment liner positioned between the first buried portion and the gate dielectric layer,
wherein the first buried portion includes a first barrier with a first work function,
wherein the second buried portion includes a second barrier with a second work function,
wherein the second work function is lower than the first work function, wherein the first barrier includes metal silicon nitride with 20 atomic percent or less of silicon and the second barrier includes metal silicon nitride with 30 atomic percent or more of silicon.

8. The semiconductor device according to claim 7, wherein the work function adjustment liner includes a material which generates a dipole so that the first work function of the first buried portion increases and is higher than the first work function.

9. The semiconductor device according to claim 7, wherein the work function adjustment liner includes metal oxide, and
wherein an areal density of oxygen atoms of the metal oxide is higher than an areal density of oxygen atoms of the gate dielectric layer.

10. The semiconductor device according to claim 7, wherein the gate dielectric layer includes silicon oxide, and
wherein the work function adjustment liner includes aluminum oxide.

11. The semiconductor device according to claim 7, wherein the gate dielectric layer includes silicon oxide, and
wherein the work function adjustment liner includes titanium oxide, hafnium oxide, zirconium oxide, magnesium oxide, or a combination thereof.

12. The semiconductor device according to claim 7, wherein the first barrier includes titanium silicon nitride with 20 atomic percent or less of silicon, and
wherein the second barrier includes titanium silicon nitride with 30 atomic percent or more of silicon.

13. The semiconductor device according to claim 7, wherein the first barrier includes tantalum silicon nitride with 20 atomic percent or less of silicon, and
wherein the second barrier includes tantalum silicon nitride with 30 atomic percent or more of silicon.

14. A semiconductor device comprising:
a substrate including a trench;
a gate dielectric layer formed over a surface of the trench;
a gate electrode positioned over the gate dielectric layer, in the trench, and at a level lower than a top surface of the substrate, wherein the gate electrode includes a first buried portion and a second buried portion, wherein the second buried portion is provided over the first buried portion;
a first doping region and a second doping region each formed in the substrate and respectively over first and second sides of the gate electrode, wherein each of the first doping region and the second doping region overlaps the second buried portion;
a first work function adjustment liner positioned between the first buried portion and the gate dielectric layer; and
a second work function adjustment liner positioned between the second buried portion and the gate dielectric layer,
wherein the first buried portion includes a first barrier with a first work function value,
wherein the second buried portion includes a second barrier with a second work function value,
wherein the second work function value is lower than the first work function value,
wherein the first barrier includes metal silicon nitride with 20 atomic percent or less of silicon and the second barrier includes metal silicon nitride with 30 atomic percent or more of silicon.

15. The semiconductor device according to claim 14, wherein the first barrier includes titanium silicon nitride with 20 at % or less of silicon, and
wherein the second barrier includes titanium silicon nitride with 30 at % or more of silicon.

16. The semiconductor device according to claim 14, wherein the first barrier includes tantalum silicon nitride with 20 atomic percent or less of silicon, and
wherein the second barrier includes tantalum silicon nitride with 30 atomic percent or more of silicon.

17. The semiconductor device according to claim 14, wherein the first work function adjustment liner includes a first metal oxide,
wherein an areal density of oxygen atoms of the first metal oxide is higher than an areal density of oxygen atoms of the gate dielectric layer,
wherein the second work function adjustment liner includes a second metal oxide, and
wherein an areal density of oxygen atoms of the second metal oxide is lower than an areal density of oxygen atoms of the gate dielectric layer.

18. The semiconductor device according to claim 14, wherein the gate dielectric layer includes silicon oxide, and
wherein the first work function adjustment liner includes aluminum oxide, titanium oxide, hafnium oxide, zirconium oxide, magnesium oxide, or a combination thereof.

19. The semiconductor device according to claim 14, wherein the gate dielectric layer includes silicon oxide, and
wherein the second work function adjustment liner includes yttrium oxide, lanthanum oxide, germanium oxide, lutetium oxide, strontium oxide, or a combination thereof.

* * * * *